(12) United States Patent
Morohashi

(10) Patent No.: US 9,359,670 B2
(45) Date of Patent: *Jun. 7, 2016

(54) SPUTTERING DEVICE FOR FORMING THIN FILM AND METHOD FOR MAKING THIN FILM

(71) Applicant: Yamaguchi University, Yamaguchi (JP)

(72) Inventor: Shinichi Morohashi, Yamaguchi (JP)

(73) Assignee: YAMAGUCHI UNIVERSITY, Yamaguchi (JP)

( * ) Notice: Subject to any disclaimer, the term of this patent is extended or adjusted under 35 U.S.C. 154(b) by 96 days.

This patent is subject to a terminal disclaimer.

(21) Appl. No.: 14/154,205

(22) Filed: Jan. 14, 2014

(65) Prior Publication Data

US 2014/0131194 A1 May 15, 2014

Related U.S. Application Data

(63) Continuation of application No. 12/992,848, filed as application No. PCT/JP2009/058976 on May 14, 2009, now Pat. No. 8,663,431.

(30) Foreign Application Priority Data

May 15, 2008 (JP) .................. 2008-127998
Nov. 21, 2008 (JP) .................. 2008-298064
Jan. 28, 2009 (JP) .................. 2009-016289

(51) Int. Cl.
C23C 14/00 (2006.01)
C23C 14/32 (2006.01)
C23C 14/34 (2006.01)
C23C 14/35 (2006.01)
H01J 37/34 (2006.01)

(52) U.S. Cl.
CPC ............. *C23C 14/3492* (2013.01); *C23C 14/35* (2013.01); *C23C 14/352* (2013.01); *H01J 37/3408* (2013.01)

(58) Field of Classification Search
CPC ................... C23C 14/352; H01J 37/3408
See application file for complete search history.

(56) References Cited

U.S. PATENT DOCUMENTS 5,116,479 A 5/1992 Nakamura et al.
2006/0065525 A1 3/2006 Weichart
(Continued)

FOREIGN PATENT DOCUMENTS

JP 63-277756 A 11/1988
JP 3-240944 A 10/1991
(Continued)

OTHER PUBLICATIONS

Satoru Takazawa et al: "Characteristics of ITO Film Formed by Facing Target Sputtering Method," *ULVAC Technical Journal*, No. 64, Mar. 2006, pp. 18-22.

*Primary Examiner* — Ibrahime A Abraham
(74) *Attorney, Agent, or Firm* — Rabin & Berdo, P.C.

(57) ABSTRACT

A device and a method of facing target sputtering are provided, which can easily change magnetic flux line patterns between facing targets, thereby enabling to conveniently perform a plurality of kinds of sputtering such as facing target sputtering with facing mode, facing target sputtering with mixed mode composed of facing mode and magnetron mode. Thus, the device and the method of facing target sputtering effective for each material is provided. The sputtering device for forming a thin film in which a pair of target holders 2 having targets 1 arranged thereon is provided so as to arrange targets faced to each other. A pole group including a plurality of pole elements having at least a different pole direction is arranged at the back side of the target holders opposite to surfaces on which the targets are arranged. The pole elements are any of a permanent magnet 4, a yoke 7, 8 and an electromagnet 13 or a combination of them. The device includes magnetic flux-line pattern control means for changing magnetic flux-line pattern 5 between the targets faced to each other by moving at least part of the pole elements or changing at least either one of field intensity and direction.

9 Claims, 14 Drawing Sheets

(56) References Cited

U.S. PATENT DOCUMENTS

| | | |
|---|---|---|
| 2007/0205096 A1 | 9/2007 | Nagashima |
| 2008/0210546 A1 | 9/2008 | Ukishima et al. |

FOREIGN PATENT DOCUMENTS

| | | |
|---|---|---|
| JP | 5-018291 A | 1/1993 |
| JP | 5-214527 A | 8/1993 |
| JP | 6-017248 A | 1/1994 |
| JP | 2000-273628 A | 10/2000 |
| JP | 2002-69637 | 3/2002 |
| JP | 2002-363742 A | 12/2002 |
| JP | 2003183827 A | 7/2003 |
| JP | 2004-52005 | 2/2004 |
| JP | 2005-179716 A | 7/2005 |
| JP | 2007-039712 A | 2/2007 |
| JP | 2008-149635 A | 7/2008 |
| WO | WO-2007/010798 A1 | 1/2007 |
| WO | WO 2008/149635 A1 | 12/2008 |

(a) Facing Mode (b) Mixed Mode (c) Shape of Movable Yoke (a) Facing Mode (b) Mixed Mode Fixed Yoke    Movable Yoke (c) Shape of Yoke (a) Facing Mode    (b) Mixed Mode Movable Yoke    Fixed Yoke
(c) Shape of Yoke (a) Facing Mode    (b) Mixed Mode (a) Facing Mode      (b) Mixed Mode (a) Facing Mode      (b) Mixed Mode (a) Facing Mode	(b) Mixed Mode (a) Facing Mode  (b) Mixed Mode (a) Facing Mode  (b) Mixed Mode (a) Forming Initial Growth Layer in Facing Mode (b) Forming Thin Film in Mixed Mode after Initial Growth Layer (a) Electromagnet: De-energization of Coil
(Facing Mode)

(b) Electromagnet: Energization of Coil
(Facing Mode)

(c) Electromagnet: Energization of Coil
(Mixed Mode)

(a) Electromagnet: De-energization of Facing
Coils (Facing Mode)
Energization of Other Coils (b) Electromagnet: Energization of Facing
Coils (Facing Mode)
Energization of Other Coils (c) Electromagnet: Energization of Facing
Coils (Mixed Mode)
Energization of Other Coils (a) Facing Target Sputtering with Sputtering-Mode Switching Function Forming ITO Initial Growth Layer in Facing Mode (b) Facing Target Sputtering with Sputtering-Mode Switching Function Forming thin-film in Mixed Mode after ITO Initial Growth Layer (a) Cross-Sectional View      (b) External View from Below (a) Without Back Yoke      (b) With Back Yoke (a) Without Back Yoke          (b) With Back Yoke (a) Without Back Yoke          (b) With Back Yoke

SPUTTERING DEVICE FOR FORMING THIN FILM AND METHOD FOR MAKING THIN FILM

CROSS-REFERENCE TO RELATED APPLICATIONS

This is a Continuation of U.S. application Ser. No. 12/992,848, filed on Nov. 15, 2010, and allowed on Oct. 15, 2013, the subject matter of which is incorporated herein by reference. This invention relates generally to a sputtering device for forming a thin film which includes a single-layer and a multi-layer structure and a method for forming the thin film, which are indispensable for industries of electronics, watches, machinery and optics.

BACKGROUND OF THE INVENTION

When manufacturing 1) an electronic material that is formed in a structure of a single-layer thin film and a multi-layer thin-film and 2) an electronic device that is application of the electronic material, a sputtering device for forming a thin film under vacuum conditions is significant. Methods of forming a thin film generally include vapor deposition, sputtering and CVD (Chemical Vapor Deposition). Above all, sputtering is widely used in various fields, because any material regardless of substrate material can be safely deposited on the substrate with a comparatively simple device without using toxic gases.

A principle of sputtering is generally described hereinafter. Ions in plasma, generated in a vacuum chamber, impinge on a target so as to cause ejection of constituent atoms and molecules from the target surface, thereby forming a thin film with these constituent atoms and molecules deposited on the substrate. The sputtering device is provided with various types of configurations depending on an ionized gas as an impact ion source, generation methods of discharge plasma, types of applied power supply or electrode structures as shown in FIGS. 18 to 24.

Ion-beam sputtering shown in FIG. 18 introduces irradiation ions generated in an ion chamber into a sputtering chamber where sputtering of a target is performed to deposit a thin film. Kaufman ion source with a thermal cathode type or an ECR (Electron Cyclotron Resonance) ion source is employed depending on the methods of generating ions. In either case, sputtering is performed with an Ar ion beam, introduced and irradiated on a target. Even when pressure of discharge is as low as $10^{-4}$ Torr or less, sputtering can be performed, and with small discharged gas incorporation into a thin film and a large kinetic energy of sputter particles, precise thin-film formation with superior surface smoothness can be achieved. However, the deposition rate of the thin film is disadvantageously low.

In sputtering shown in FIG. 19 and FIG. 20, plasma ions, accelerated in a cathode fall region, impact a target to cause sputtering, and thus sputtered particles are deposited on the facing substrate, forming a thin film. In FIG. 20, a target unit 3, including a target 1 and a target plate (target holder) 2, is shown. Direct current (DC) sputtering or alternate current (RF) sputtering is employed depending on the applied power supply. Although device configuration is simple, 1) gas pressure introduced to cause plasma must be high due to low plasma efficiency, thus gas incorporation into a thin film is high, 2) deposition rate of the thin film is eventually low due to low plasma efficiency, 3) since high-energy γ electrons (secondary electrons), generated when ion gas impacts the target 1, hit a squarely facing substrate, temperature of the substrate goes up to several hundred degrees (° C.) during deposition, 4) since the target 1 and the substrate are squarely facing, part of ions that impact the target 1 directly hits the substrate (recoil ion), damage to the substrate and compositional shift in multi-component film are disadvantageously caused.

Magnetron sputtering was devised to solve problems of two-pole sputtering. FIG. 21 shows a view showing the principle of a typical planar magnetron sputtering. In FIG. 21, a magnet 4 with north pole 4(N) and south pole 4(S) is shown. Magnetic flux lines 5 are also shown. Direct current (DC) sputtering or alternate current (RF) sputtering is employed depending on type of the applied power supply. As described in two-pole sputtering, high-energy γ electrons generated when ion gas impacts the target 1, hit an facing substrate, thereby principally causing temperature rise in the substrate. However, the γ electrons play an important role in keeping the plasma discharge with ionized gas at high energy. As shown in FIG. 21, the magnet 4 is arranged behind the target 4 to generate a curved magnetic field 5 such that γ electrons discharged from the surface of the target 1 are confined near the target surface to increase the number of collision with atmospheric gas. Therefore, there are the following aspects: 1) improving plasma efficiency by accelerating ionization of atmospheric gas (high-rate sputtering) and 2) restraining temperature rise in the substrate due to impact of high-energy γ electrons to the substrate by a closed migration pathway as shown in the drawing (low temperature sputtering). With arrangement of magnetron, the problem of two-pole sputtering was greatly remedied. However, since the substrate and the target 1 are squarely facing to each other, there is a possibility that part of the curved magnetic field reaches the substrate without closing, and thus 1) injection of γ electrons into the substrate and 2) injection of recoil ions into the substrate cannot be completely restrained. Further, if ferromagnetic material is the target, the magnetic field of magnet goes through part of the ferromagnetic material, thereby preventing a magnetic field from being applied to the surface of the target 1 largely enough to confine γ-electrons. Therefore, low-temperature and high-speed sputtering of ferromagnetic material is disadvantageously difficult. However, planer magnetron sputtering, which enables formation of a thin film at a high-speed deposition rate with the comparatively simple structure, is widely used.

Facing target sputtering (see patent literatures 2 and 3) shown in FIG. 22 has been devised to overcome the problems of magnetron sputtering. Two targets 1 are faced to each other such that the magnets 4 with opposite poles are arranged at each back side of the targets. The high-energy γ electrons released from the target surfaces in response to impact of ionized atmospheric gas on the targets generate high-density plasma confined between the facing targets. Since the substrate is placed beside the facing targets outside of the plasma, γ electrons and recoil ions are completely prevented from being injected into the substrate, and thus low temperature sputtering can be achieved. With high-density plasma that confines γ electrons, atmospheric gas pressure can be lowered (down to $10^{-2}$ Pa) while performing the discharge and atmospheric gas incorporation into a thin film can be reduced. Therefore, low-temperature sputtering can be performed characteristically when ferromagnetic material is used as a target. Direct current (DC) sputtering or alternate current (RF) sputtering is available depending on the applied power supply.

However, when comparing FIG. 21 and FIG. 22, it can be found that the magnetic field 5 generated by the magnet 4 that is arranged at the rear surface of the target is closed in the planar magnetron sputtering, while magnetic flux lines are closed in the conventional facing target sputtering with opposite pole of magnets arranged between the targets that are facing to each other, as can be seen from the targets, the magnets at the rear surfaces of the targets and the appearance of the magnetic field lines in the conventional sputtering. However, as apparently shown in the drawings, the opposite surface of the magnets cannot form closed magnetic flux lines, and thereby leak of magnetic flux lines occurs. The leak of magnetic field at the rear surface means that magnetic field is reduced by that amount between the facing targets and the magnetic field generated by the magnet cannot be effectively guided to the facing targets, and therefore the magnets are not used efficiently. To reduce the above effect, a thick iron yoke must be placed behind poles opposite to the targets in order to reduce the leaked magnetic field, and thereby the overall structure becomes inevitably large. The magnetic field between the facing targets is required to be approximately 150 to 250 Oe (oersted). A neodymium magnet is used to generate a large magnetic field between the facing targets however, thickness of the magnet must be large enough to prevent the magnetic field from developing effectively in response to occurrence of the leaked magnetic field at the pole opposite to the targets as described above. Further, since saturation magnetization of iron yoke is limited, the iron yoke, if it is made too much thin, is magnetically saturated, and thus the magnetic field is leaked behind the iron yoke. The iron yoke for reducing leaked magnetic field is also required to be designed large in thickness. In the magnetron sputtering shown in FIG. 21, the thickness of magnet and iron yoke can be reduced around 60 mm since the magnetic field is closed both at front and back surfaces of the magnet, while in the conventional composed-mode composed-target sputtering, the thickness of magnet and iron yoke eventually becomes around 80 mm.

Although it is advantageous that damage is small, it is hard to obtain high deposition rate comparing to magnetron sputtering due to positional relation to the substrate, and therefore it is disadvantageous in view of productivity. To increase the deposition rate, if applied power is increased with respect to DC power supply for DC sputtering or AC power supply for RF sputtering, plasma is likely to concentrate between the center portions of targets and thereby causing saturation phenomenon of the applied power and deposition rate cannot be increased due to the saturation.

In contrast, in a facing target sputtering with mixed mode (see patent literature 1) combining facing mode and magnetron mode as shown in FIG. 23, the magnet 4 is arranged at the rear surface of the one target unit 3 at the same position as the magnetron sputtering shown in FIG. 21, while the magnet 4 is arranged at the rear surface of another facing target unit 3 such that the opposite pole is arranged with respect to the one magnet. A back yoke 6 is also shown. A curved magnetic field (magnetron mode) is formed on each of the target surfaces as in the magnetron sputtering, while a vertical magnetic field (facing mode) is formed between the facing targets due to opposite poles. Leak of magnetic flux lines outside of a target holder caused as a problem in the facing mode facing target sputtering in FIG. 22 is resolved by formation of a closed magnetic circuit due to opposite poles as shown in FIG. 23, and thickness of the iron yokes can be sufficiently around the same as in the magnetron sputtering, which is thinner than in the facing target sputtering. The positional relations between the substrate and the facing two targets are the same as the facing target sputtering and the magnetic field is configured hardly to be injected into the substrate, and thus a low-temperature sputtering can be realized.

In the mixed mode, with formation of magnetic field by the magnetron mode and the facing mode, saturation of deposition rate, caused by increasing an applied power to sputtering only based on the facing mode, hardly occurs, and thus a significantly high deposition rate can be advantageously obtained.

However, if the target 1 is ferromagnetic material as shown in FIG. 24, magnetic flux lines 5 of the magnet 4 go through part of the ferromagnetic material and a curved magnetic field on the magnetron mode is hardly applied to the surface of the target, and thereby only the component of vertical magnetic field on the facing mode is applied thereto. A target 1a of ferromagnetic material and weak magnetic flux lines 5a are shown in FIG. 24. If strength of magnets is the same, the magnetic field on the facing mode between ferromagnetic targets is reduced compared to facing target sputtering with facing mode as shown in FIG. 22 in proportion to buried curved magnetic field on the magnetron mode into the ferromagnetic target. A low-temperature high-speed sputtering of ferromagnetic material with high-density plasma confining $\gamma$ electrons is disadvantageous in performance compared to a pure facing target sputtering with facing mode. It is found from the results of magnetic field simulation that the vertical magnetic field is halved in size compared to that in the case of the single facing mode due to the effect brought by formation of a loop magnetic field. This reduced vertical magnetic field will diminish the effect of confining $\gamma$ electrons between the targets compared to the effect in the case of the single facing mode. In short, the mixed mode has more effect of low-temperature sputtering than magnetron sputtering, however the effect is slightly less than the single facing mode.

Electronic elements or optical thin films are mostly formed in a multilayer film structure in recent years, and the multilayer film structure is required to be made without breaking vacuum conditions. And, the thin-film includes a variety of materials such as magnetic material, non-magnetic material, metal material, dielectric material, etc. When making the multi-layer film structure by using the facing target sputtering as shown in FIG. 23, facing target cathodes corresponding to each kind of film of the multilayer film are required to be arranged in parallel as shown in FIG. 25. Similarly, magnetron cathodes corresponding to each kind of film of the multilayer film are required to be arranged also in magnetron sputtering shown in FIG. 21. When making by sputtering the multilayer film structure including a mixture of magnetic material, non-magnetic material, metal material, dielectric material, etc. in the same vacuum device, making selective use of sputtering that is effective to each material is required to provide a high-quality multilayer film structure. As described above, the low-temperature sputtering can be realized by the facing target sputtering with facing mode shown in FIG. 22 and the facing target sputtering with mixed mode shown in FIG. 23.

To make a multi-layer film structure with various kinds of materials, respectively different targets and sputtering conditions must be selected. Besides selection of the facing target sputtering shown in FIG. 22 or the magnetron sputtering shown in FIG. 21, a plurality of targets corresponding to the number of film kinds of multilayer film are inevitably arranged in parallel as shown in FIG. 26 or the device with box rotating targets as shown in FIG. 27 (see patent literature 4) must be provided.

Further, in recent years, a flexible device forming a transparent conductor on organic thin-film substrate is desired in a wide range of areas including display elements represented by organic EL elements and solar batteries. For this purpose, sputtering must be applied to an organic thin-film substrate with thermal and physical susceptibilities. Therefore, so-called low-temperature sputtering technology, which causes no damage, is desired. Generally, this means a slow deposition at low deposition rate. On the other hand, however, a high-speed deposition technology is desired from a point of view of productivity.

If applied power is increased to perform a high-speed sputtering, deposition rate is increased. However, atoms and molecules from the target hit the substrate with a large kinetic energy, thereby causing damage to the thin film and the substrate. More particularly, as described above, if magnetron sputtering capable of high-speed sputtering is used, generated γ electrons and recoil gas (generally argon gas) cause damage to the substrate, bring temperature rise in the substrate and cause incorporation of negative ions into the thin-film layer. A solution of these existing contradictory problems has been desired.

In non-patent literature 1 and patent literature 5, when making a transparent conductive film on as-grown film, an initial growth layer is formed by the facing target sputtering and the remaining layers are formed by the magnetron sputtering. In either method of sputtering, a voltage is applied to perform sputtering with the target as a cathode and the vacuum device side as an anode. The initial growth layer of the thin film is made with the facing target sputtering causing little damage, while the remaining layers are made with magnetron sputtering that may cause some damage but can secure high-speed deposition rate depending on the existence of the initial growth layer, which can mitigate damage to as-grown layer. In this manner, a transparent conductive film is formed. A single chamber must accommodate two cathodes and a transfer device including cathodes of facing target sputtering and a substrate transfer mechanism between cathodes of magnetron sputtering, and therefore the increase of chamber capacity causes a problem.

PRIOR ARTS

Patent Literature

Patent literature 1: Publication of Unexamined Patent Application No. 2005-179716
Patent literature 2: Publication of Unexamined Patent Application No. Heisei 6-17248
Patent literature 3: Publication of Unexamined Patent Application No. Heisei 5-18291
Patent literature 4: International Publication Pamphlet No. 2008/149635
Patent literature 5: Publication of Unexamined Patent Application No. 2007-39712

Non-Patent Literature

Non-patent literature 1: ULVACTECHNICAL JOURNAL NO. 64 (2004) pp 18-22

SUMMARY OF THE INVENTION

Problems to be Solved by the Invention

Facing target sputtering with facing mode is regarded as effective methods for ferromagnetic materials, and facing target sputtering with mixed mode is regarded as effective methods for non-ferromagnetic materials. However, in the conventional facing target sputtering, it has been very difficult to change magnetic flux-line patterns between the facing targets though such changes may bring a significant advantage. In such a case, the whole magnets are required to be changed. This situation is the same as in magnetron sputtering. There has been no concept of changing magnetic flux-line patterns in the same cathode of the same sputtering device according to the changes of materials for sputtering. When making by sputtering the multilayer film structure including a mixture of magnetic material, non-magnetic material, metal material, dielectric material, etc. in the same vacuum device, making selective use of sputtering that is effective to each material is required to provide a high-quality multilayer film structure. However, no device has been available to meet the request.

An object of the present invention is to solve the above problems, easily change the magnetic flux-line patterns between facing targets, conveniently select a plurality of sputtering such as facing target sputtering with facing mode and facing target sputtering with mixed-mode, and thereby provide an facing target sputtering effective to each material. Further, an object of the present invention is to provide a device and a method to solve contradictory problems of low damage and high-speed deposition and perform sputtering in succession at a plurality of modes without transferring the substrate in a vacuum chamber.

Means for Solving the Problems

To solve the above problems, the present invention includes the following configuration. A sputtering device for forming a thin film in which a pair of target holders having targets arranged thereon is provided so as to arrange targets facing to each other, and a pole group including a plurality of pole elements having at least different pole directions is arranged at the back side of the target holders opposite to surfaces on which the targets are arranged, and the pole elements are any of a permanent magnet, a yoke and an electromagnet or a combination of them, and the device includes magnetic flux-line pattern control means for changing magnetic flux-line patterns between the targets facing to each other by moving at least part of the pole elements or changing at least either one of field intensity and direction.

Further, the present invention includes the following configuration. A method of forming a thin film, wherein when forming a new thin film on a substrate, a sputtering is performed with magnetic flux lines formed in accordance with polarity between a pair of facing targets (facing mode), and a subsequent sputtering is performed with loop magnetic flux lines formed on each surface of a pair of facing targets while magnetic flux lines are also formed between the facing targets (mixed mode).

Further, the present invention may preferably include the following embodiment. Each of pole elements of the pole group is arranged such that pole directions are alternately different between pole elements adjacent to each other.

Further, the present invention may preferably include the following embodiment. The pole group includes pole elements with different pole directions, which are arranged in a concentric pattern.

Further, the present invention may preferably include the following embodiment. The pole elements include at least a permanent magnet or a yoke, and magnetic flux-line patterns between the targets facing to each other can be changed by moving a part or whole of a plurality of pole elements in said pole group.

Further, the present invention may preferably include the following embodiment. The pole elements include at least a yoke and a magnet, and the magnet is a permanent magnet or an electromagnet, and at least part of the yoke is movable, and the yoke can be moved apart from at least one of the rear surface of the target holder and the magnet by moving at least part of the yoke.

Further, the present invention may preferably include the following embodiment. One end of the yoke is contacted with or proximate to the rear surface of the target holder, and other end of the yoke is magnetically connected to a magnetic pole of the magnet located at the opposite side of the rear surface of the target.

Further, the present invention may preferably include the following embodiment. A magnetic flux-line patterns between the targets is a mixed mode when the yoke is proximate to at least one of the rear surface of the target holder and the magnet, and said magnetic flux-line patterns between the targets is an facing mode when the yoke is apart from at least one of the rear surface of the target holder and the magnet.

Further, the present invention may preferably include the following embodiment. The pole elements include at least an electromagnet and the sputtering device further includes a controller configured to control direction and strength of electric current so that at least one of magnetic polarity and its strength of the electromagnet can be changed.

In the above configuration, switching of modes is made by using an electromagnet. That is, with an electromagnet, magnetic polarity of magnet can be reversed by changing direction of current following through a coil so that the whole part including not only a permanent magnet but an electromagnet can be in facing mode. Also, the whole part can be in mixed mode. Furthermore, strength of each mode can be adjusted in response to various kinds of substrates and the best condition for the material of thin film can be selected by changing energization amount of the electromagnet coil.

Further, the present invention may preferably include the following embodiment. The target holder includes two or more rotatable polygonal column target holders with the axes of rotation arranged in the same plane, and each of targets is placed on each surface of the target holders and facing surfaces of targets can be created by rotating at least one of each target holder.

Further, the present invention may preferably include the following embodiment. The target holders are facing to each other as one module and one or more said modules are provided in a vacuum chamber.

Further, the present invention may preferably include the following embodiment. In a method of forming a thin film, the thin film has a multilayer film structure, and when forming at least the lowest layer of the film in the multilayer film structure, a first sputtering is performed in the facing mode and a subsequent sputtering is performed in the mixed mode.

Further, the present invention may preferably include the following embodiment. A method of forming a thin film using a sputtering device for forming a thin film wherein when forming a new thin film on a substrate, a sputtering is performed by said magnetic flux-line pattern control means with magnetic flux lines formed in accordance with polarity between a pair of facing targets (facing mode), thereby forming an initial growth layer, and a subsequent sputtering is performed by said magnetic flux-line pattern control means with loop magnetic flux lines formed on each surface of a pair of facing targets while magnetic flux lines are also formed between the facing targets (mixed mode).

Further, the present invention may preferably include the following embodiment. A method of forming a thin film with multilayer film structure using a sputtering device for forming a thin film wherein different materials are used for each target of said polygonal column target holder, when forming at least the lowest layer in the multilayer film, a sputtering is performed by the magnetic flux-line pattern control means with magnetic flux lines formed in accordance with polarity between a pair of facing targets (facing mode), thereby forming an initial growth layer, and a subsequent sputtering is performed by said magnetic flux-line pattern control means with loop magnetic flux lines formed on each surface of a pair of facing targets while magnetic flux lines are also formed between the facing targets (mixed mode), thereby completing formation of the thin film, and the polygonal column target holder is subsequently rotated and a different kind of thin film is formed.

Iron is commonly used for the yoke and the pole piece, though any magnetic materials can be used.

Advantage of the Invention

According to the present invention, with the highly-functional arrangement of the pole group, magnetic flux-line patterns between facing targets can be easily changed, and thus a plurality of modes of facing target sputtering such as facing target sputtering with facing mode, facing target sputtering with mixed mode composed of both facing and magnetron modes, etc. can be conveniently performed. Accordingly, when forming a multilayer film structure including magnetic material, non-magnetic material, metal material, dielectric material, etc. in the same vacuum device using an facing target sputtering, an facing target sputtering method can be applied effectively to each material, and thus formation of high-quality multilayer film structure can be achieved. Also, a significantly compact device can be applied to a mode of moving a yoke or a permanent magnet, and thus a plurality of modes or a multilayer thin film can be formed in a small vacuum device without breaking vacuum conditions.

Further, according to the present invention, when forming a thin film on a substrate, first a thin film of initial growth layer is formed in an facing mode, then the remaining thin film is subsequently formed in a mixed mode. As such a uniform formation of thin film can be achieved in a short formation time without damaging early formed thin-film layers in a substrate material or a multilayer thin film. Furthermore, a feature of the present invention can be applied to any material of the substrate such as transparent electrical conducting material, magnetic material, non-magnetic material, metal material, dielectric material, etc. Above all, without doing damage to the substrate including a heat-sensitive and fragile material such as an organic polymeric material, etc., high-speed formation of thin film can be achieved.

According to the present invention, high-quality and high-performance electronic devices can be produced in a wide range of areas in which low-temperature sputtering causing little damage is required. The areas include: organic EL element, liquid crystal belonging to the same display group as organic EL element, which requires deposition of transparent electrode ITO without causing damage due to heat-sensitivity, superconducting tunnel junction (STJ) in which atomic-level interfacial control is required such that tunnel barrier of 1 nm (nanometer) in thickness is sandwiched by both superconducting thin films, ferromagnetic tunnel junction in which tunnel barrier is sandwiched by ferromagnetic thin films, soft X-ray reduced projection lithography defined as semiconductor lithography technology after 70 nm rule (64 G bit Dram), multilayer X-ray mirrors required for an X-ray microscope for characterization, LED, etc.

BRIEF DESCRIPTION OF THE DRAWINGS

FIG. 1 (*a*) is a view illustrating facing target sputtering with facing mode, FIG. 1(b) is a view illustrating facing target sputtering with mixed mode composed of both facing and magnetron modes and FIG. 1 (c) is a view illustrating a movable yoke shape.

FIG. 2 (a) is a view illustrating facing target sputtering with facing mode, FIG. 2(b) is a view illustrating facing target sputtering with mixed mode and FIG. 2 (c) is a view illustrating a fixed yoke shape and a movable yoke shape.

FIG. 3 (a) is a view illustrating facing target sputtering with facing mode, FIG. 3(b) is a view illustrating facing target sputtering with mixed mode and FIG. 3 (c) is a view illustrating a fixed yoke shape and a movable yoke shape.

FIG. 4 (a) is a view illustrating facing target sputtering with facing mode, FIG. 4(b) is a view illustrating facing target sputtering with mixed mode.

FIG. 5 (a) is a view illustrating facing target sputtering with facing mode, FIG. 5(b) is a view illustrating facing target sputtering with mixed mode.

FIG. 6 (a) is a view illustrating facing target sputtering with facing mode, FIG. 6(b) is a view illustrating facing target sputtering with mixed mode.

FIG. 8 (a) is a view illustrating facing target sputtering with facing mode, FIG. 8(b) is a view illustrating facing target sputtering with mixed mode.

FIG. 10(a) is a view illustrating facing target sputtering with facing mode, and FIG. 10(b) is a view illustrating facing target sputtering with mixed mode.

FIG. 11(a) is a view illustrating the facing target sputtering with facing mode, and FIG. 11(b) is a view illustrating facing target sputtering with mixed mode.

FIG. 22(a) is without a yoke and FIG. 22(b) is with a yoke.

FIG. 23(a) is without a yoke and FIG. 23(b) is with a yoke.

FIG. 24(a) is a cross-sectional view without back yokes and FIG. 24(b) is a cross-sectional view with back yokes.

DETAILED DESCRIPTION OF EMBODIMENTS OF THE INVENTION

Embodiment 1

Hereinafter, Embodiment 1 according to an embodiment of the present invention is described with reference to FIGS. 1 to 6.

Sputtering in the magnetron mode, when making a magnetic circuit using a plurality of pole groups with different polarities, has the pole groups generally arranged in a balanced arrangement such that strength of magnetic field is balanced with different polarities. According to the present invention, in the pole group including a magnet and a yoke contacted or proximate to each other, an outside loop magnet and a yoke arranged in the center of the outside loop magnet are provided such that non-balanced magnetron mode is formed. Since non-balanced magnetron mode is formed, density of magnetic field can be increased in proportion to the facing mode in the mixed mode composed of a combination of the facing mode and the magnetron-mode.

Figure 1:
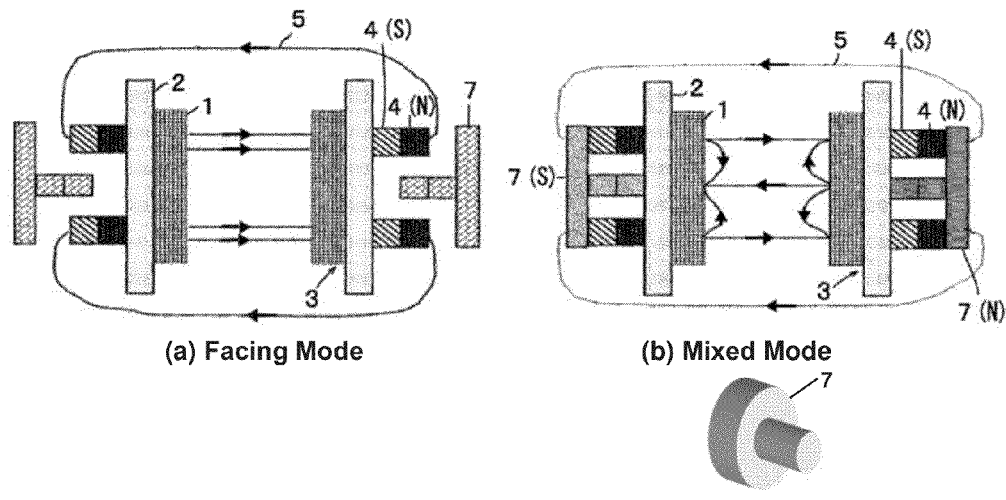
FIG. 1 is a schematic view of Embodiment 1-1.

FIG. 1 shows an example of Embodiment 1-1 according to the present invention. In FIG. 1, in a pole group including a magnet and a yoke contacted or proximate to each other on the rear surface of the target 1, an outside loop magnet and a yoke arranged in the center of the outside loop magnet are provided such that magnetron mode is formed. In FIG. 1, a target unit 3, composed of the target 1 and a target plate 2, is shown. A pole group, including a magnet 4 and a movable yoke 7, is arranged on the rear surface of the target unit 3. 4(N) stands for north pole of the magnet 4, 4(S) stands for south pole of the magnet 4, 7(N) stands for the movable yoke 7 magnetized in north pole, and 7(S) stands for the movable yoke 7 magnetized in south pole respectively. Also magnetic flux lines 5 are shown in FIG. 1. The magnet 4 is arranged on the rear surface of the respective target units 3 facing to each other and magnetic flux lines 5 are generated between the targets 1 as shown in FIG. 1. The movable yoke 7 is arranged movably in a direction orthogonal to the surface of the target 1. FIG. 1(a) shows a state in which the movable yoke 7 is apart from the magnet 4, FIG. 1(b) shows a state in which the movable yoke 7 is contacted with the magnet 4 and FIG. 1(c) shows a shape of the movable yoke 7. According to FIG. 1(a), since movable yoke 7 is apart from the magnet 4 and the target unit 3, the movable yoke 7 does not affect the magnetic circuit and the magnetic flux lines 5 are arranged in the facing mode as shown in the drawing, and thus this configuration can be used as the facing target sputtering with facing mode. According to FIG. 1(b), since the movable yoke 7 is contacted with the rear surface of the magnet 4, the movable yoke 7 is magnetized into north pole 7(N) or south pole 7(S). Accordingly, the magnetic field generated at the surface of the target 1 by the movable yoke 7 is directed in a direction contrary to the magnetic field generated by the magnet 4 adjacent to the movable yoke 7, and magnetic flux lines 5 are generated between the movable yoke 7 and the magnet 4 as shown in the drawing. Also, the magnetic flux lines 5 are generated between the facing targets 1 as shown in the drawing. Thus, this configuration can be used as the facing target sputtering with mixed mode composed of a combination of the magnetron mode and the facing mode. As can be seen, with the movable yoke 7 being moved in the pole group, the pattern of the magnetic flux lines 5 between the facing targets 1 can be changed.

Figure 2:
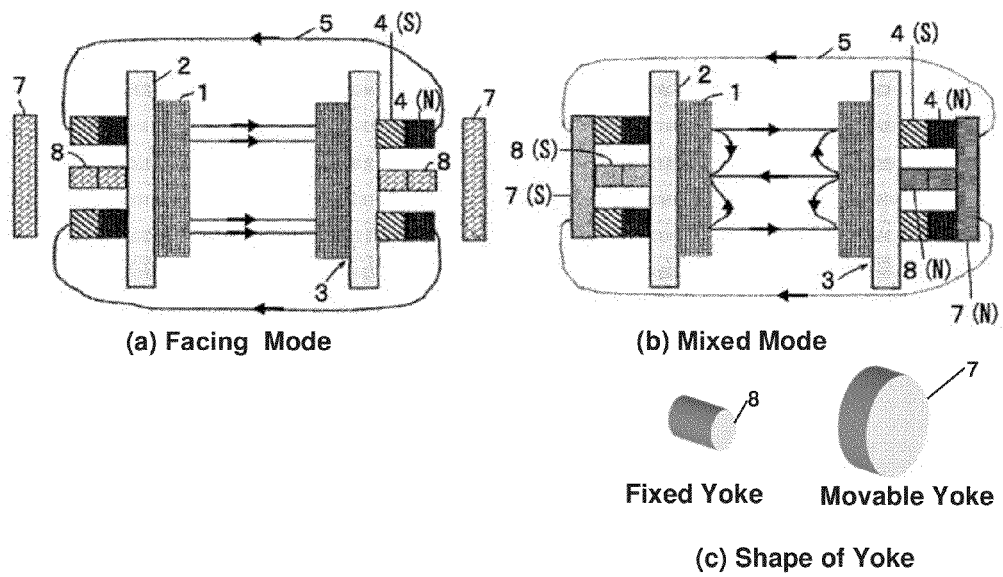
FIG. 2 is a schematic view of Embodiment 1-2.

FIG. 2 is a view illustrating an example of Embodiment 1-2 according to the present invention. FIG. 2 shows an embodiment in which part of the yoke 7 and 8 is moved. Although a whole yoke is moved in FIG. 1, the yoke is divided into the movable yoke 7 and the fixed yoke 8 and only the movable yoke 7 is moved in an embodiment shown in FIG. 2. FIG. 2(a) shows a state in which the movable yoke 7 is apart from the magnet 4, FIG. 2(b) shows a state in which the movable yoke 7 is contacted with the magnet 4 and FIG. 2(c) shows an example of the shapes of the fixed yoke 8 and the movable yoke 7. 8(N) stands for the fixed yoke 8 magnetized into north pole, while 8(S) stands for the fixed yoke 8 magnetized into south pole. FIG. 2(a) shows a state of the facing target sputtering with facing mode, while FIG. 2(b) shows a state of the facing target sputtering with mixed mode composed of a combination of the magnetron mode and the facing mode. Part of the yoke in the pole group is moved so that the magnetic flux-line patterns between facing targets can be changed. The configuration can be more simplified with only part of the yoke being movably arranged than a whole of the yoke is movably arranged.

Figure 3:
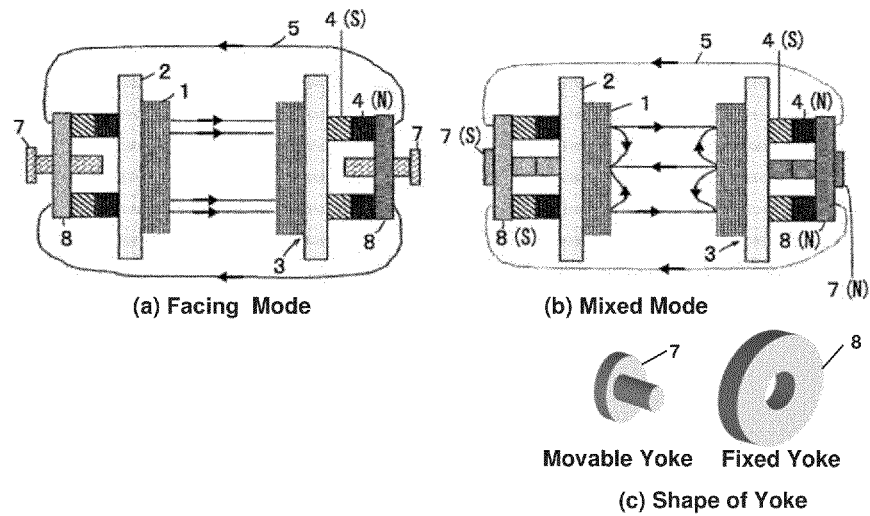
FIG. 3 is a schematic view of Embodiment 1-3.

FIG. 3 is a view illustrating an example of Embodiment 1-3 according to the present invention. FIG. 3 shows another embodiment in which part of the yoke 7 and 8 is moved. FIG. 3(a) shows a state in which the movable yoke 7 is apart from the magnet 4, FIG. 3(b) shows a state in which the movable yoke 7 is contacted with the magnet 4 and FIG. 3(c) shows an example of the shapes of the fixed yoke 8 and the movable yoke 7. FIG. 3(a) shows a state of the facing target sputtering with facing mode, while FIG. 3(b) shows a state of the facing target sputtering with mixed mode composed of a combination of the magnetron mode and the facing mode. Part of the yoke in the pole group is moved so that the pattern of the magnetic flux lines between the facing targets can be changed. FIG. 3 is different from FIG. 2 in that part of the yoke is constantly contacted with the magnet 4 arranged behind the target unit 3, thereby reducing adverse effect due to leak of magnetic flux caused by movement of part of the yoke.

Figure 4:
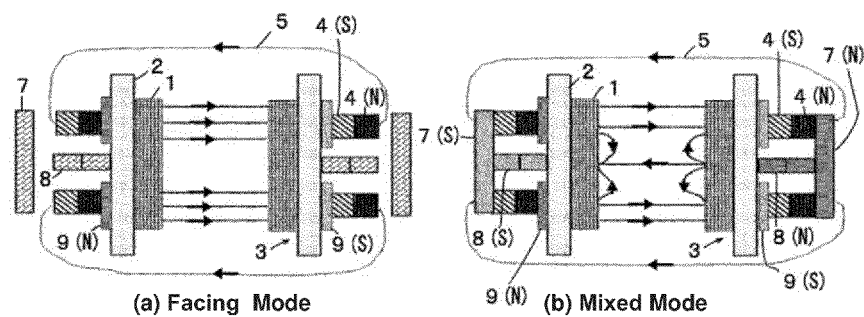
FIG. 4 is a schematic view of Embodiment 1-4.

FIG. 4 is a view illustrating an example of Embodiment 1-4 according to the present invention. FIG. 4 has basically the same configuration as the magnet group shown in FIG. 2, in which the pole group including the magnets 4 and the yokes 7 and 8 are arranged to form a magnetron mode. FIG. 4(a) shows a state in which the movable yokes 7 are apart from the magnets 4 and FIG. 4(b) shows a state in which the movable yokes 7 are contacted with the magnets 4. FIG. 4(a) shows a state of the facing target sputtering with facing mode, while FIG. 4(b) shows a state of the facing target sputtering with mixed mode composed of a combination of the magnetron mode and the facing mode. Part of the yokes 7 and 8 in the pole group is moved so that the magnetic flux-line patterns between the facing targets can be changed. FIG. 4 is different from FIG. 2 in that a pole piece 9, which has larger cross-section than the loop magnet, is placed contacted with the magnet on the side of the target, and thereby improving uniformity of the magnetic flux lines between the targets. 9(N) stands for the pole piece 9 magnetized into north pole, while 9(S) stands for the pole piece 9 magnetized into south pole. This embodiment can be applied to a large-size target brought by a large-size substrate.

Figure 5:
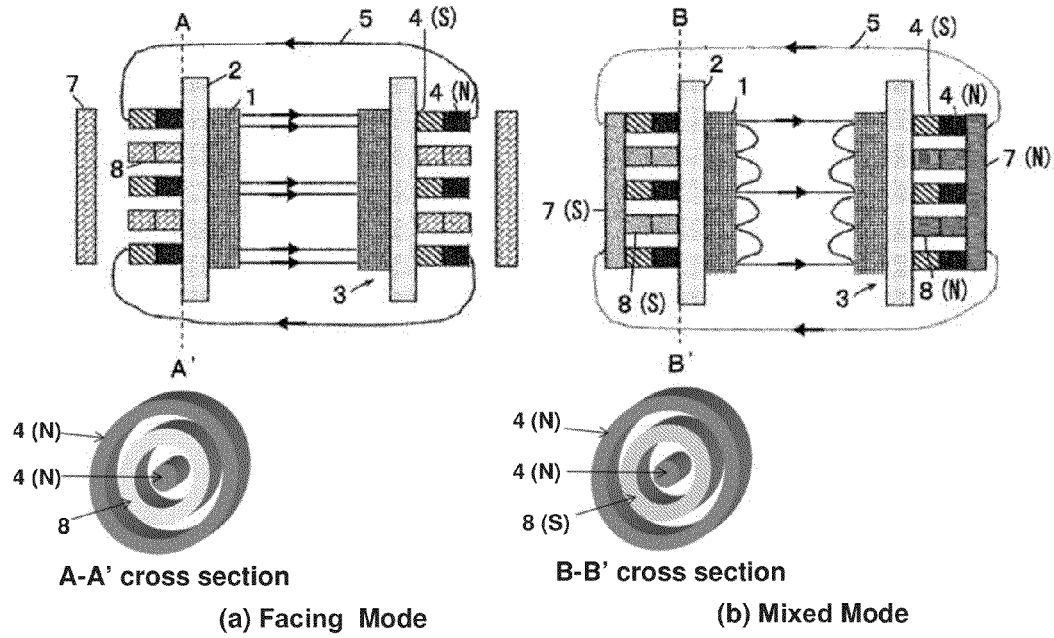
FIG. 5 is a schematic view of Embodiment 1-5.

FIG. 5 is a view illustrating an example of Embodiment 1-5 according to the present invention. FIG. 5 shows another embodiment, which can be applied to a large-size target brought by a large-size substrate. The pole group including a plurality of the magnets 4 and the fixed yokes 8 is arranged to form a magnetron mode. FIG. 5(a) shows a state in which the movable yokes 7 are apart from the magnets 4 and FIG. 5(b) shows a state in which the movable yokes 7 are contacted with the magnets 4. Further, each of the cross-sectional views shows arrangement of a plurality of the magnets 4 and the fixed yokes 8 and states of magnetization when the fixed yokes 8 are contacted with or apart from the movable yokes 7. FIG. 5(a) shows a state of the facing target sputtering with facing mode, while FIG. 5(b) shows a state of the facing target sputtering with mixed mode composed of a combination of the magnetron mode and the facing mode. Part of the yokes in the pole group is moved so that the pattern of the magnetic flux lines 5 between the facing targets can be changed.

Figure 6:
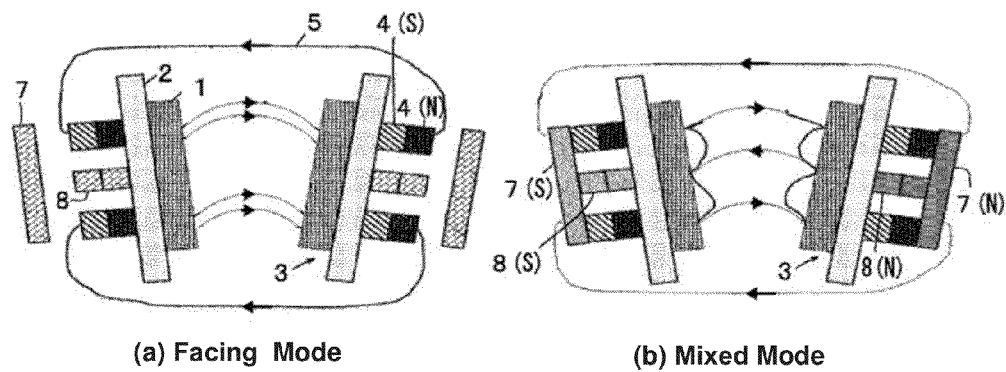
FIG. 6 is a schematic view of Embodiment 1-6.

Although the targets are squarely faced to each other according to an example of the above embodiment, each of the facing targets can be controlled to freely rotate at any angle so as to face the substrate, for example, as shown in FIG. 6 (Embodiment 1-6 according to the present invention), and thus deposition rate of the substrate can be increased.

Figure 7:
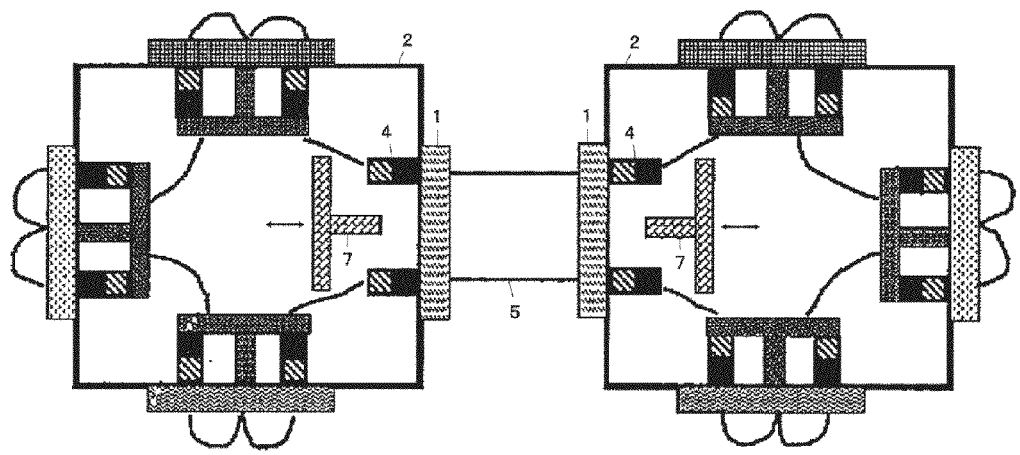
FIG. 7 is a schematic view of Embodiment 1-7 in which an example of applying movable yokes to box targets is shown.

FIG. 7 is a view illustrating Embodiments 1-7. The Embodiments 1-7 show examples in which part of the back yokes of the box-type target holder 2 as shown in the patent literature 4 is the movable yoke 7. Patterns of the magnetic flux lines between the targets 1 can be formed as the facing mode with the movable yoke 7 being apart from the magnets 4 and the target holder 2, while magnetic flux-line patterns can be formed as the mixed mode with the movable yoke 7 being contacted with or proximate to the magnet 4 and the target holder 2. Also, in this rotational multi-facing target sputtering device, only the sputtering faced surfaces are changed from the facing mode to the mixed mode, while the magnetic flux mode of the non-sputtering other surfaces are controlled to stay in the magnetron mode, and thereby restraining spread of magnetic field outside of the target holder, which has been a problem in the prior art. Although FIG. 7 adopts the arrangement shown in FIG. 1 as the arrangement of the magnets and the movable yokes at the rear surface of the box-type target holder, the arrangements shown in FIGS. 2 to 5 may also be adopted as the arrangement of the magnets, the yokes and the pole piece at the rear surface of the box-type target holder.

Embodiment 2

Next, Embodiment 2 according to an embodiment of the present invention is described with reference to FIGS. 8 to 14.

Figure 8:
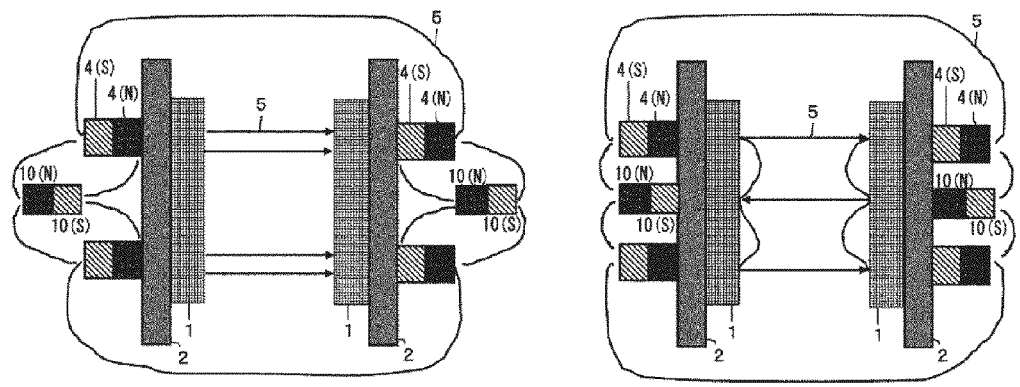
FIG. 8 is a schematic view of Embodiment 2-1.
Figure 9:
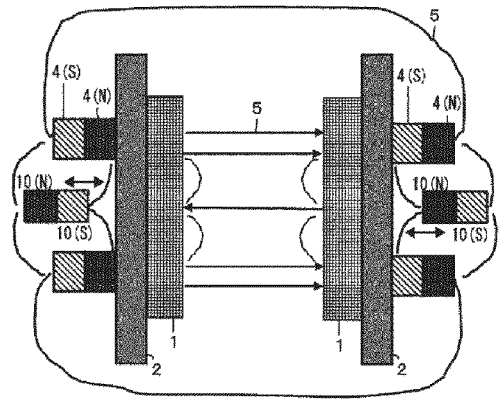
FIG. 9 is a schematic view of Embodiment 2-1 illustrating a control of magnetic flux-line patterns in the facing target sputtering with mixed mode.

While the magnetic flux-line patterns between the facing targets 1 are changed by moving the yoke 7 in the Embodiment 1, the patterns of the magnetic flux lines between the facing targets 1 are changed by moving a permanent magnet in this Embodiment. FIGS. 8 and 9 are drawings illustrating Embodiment 2-1. FIG. 8(a) shows a state in which movable magnets 10 are apart from the target plate 2 and the magnetic flux-line patterns between the targets 1 is formed as the facing mode, while FIG. 8(b) shows a state in which the movable magnets 10 are contacted with the target plate 2 and the patterns of the magnetic flux lines between the targets 1 is formed as the mixed mode. Although the movable magnet 10 is completely contacted with the target plate 2 as shown in FIG. 8(b), magnetic flux-line patterns and field intensity in the mixed mode can be controlled by controlling distance between the movable magnet 10 and the target plate 2 as shown in FIG. 9. 10(N) stands for north pole of the movable magnet 10, while 10(S) stands for south pole of the movable magnet 10.

Figure 10:
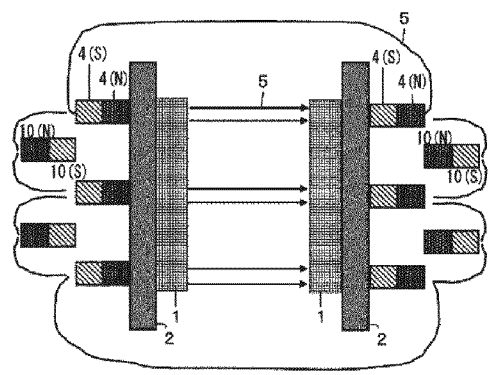
FIG. 10 is a schematic view of Embodiment 2-2.
Figure 10:
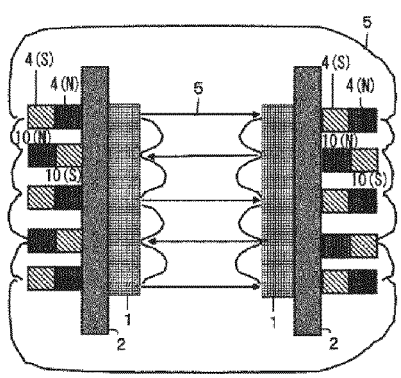

FIG. 10 is a view illustrating Embodiment 2-2. Although a single fixed magnet 4 and a single movable magnet 10 are used in the Embodiment 2-1, a combination of a plurality of fixed magnets and movable magnets may be used as shown in FIG. 10.

Figure 11:
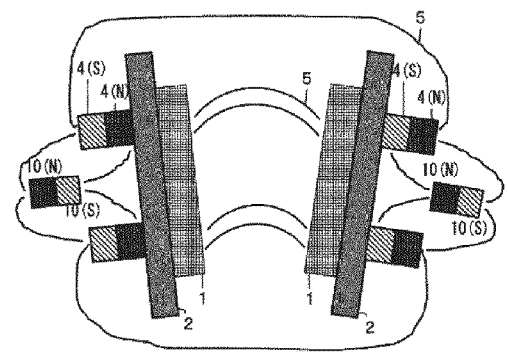
FIG. 11 is a schematic view of Embodiment 2-3.
Figure 11:
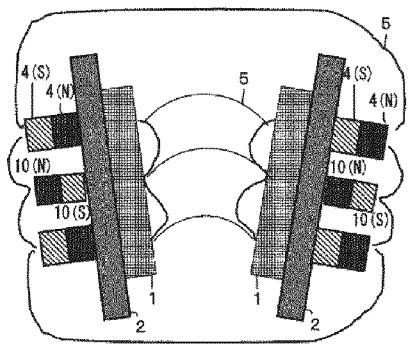

FIG. 11 is a view illustrating Embodiment 2-3. Although the targets 1 are squarely faced to each other in the Embodiment 2-1, the targets 1 may be inclined at any angle as shown in FIG. 11.

Figure 12:
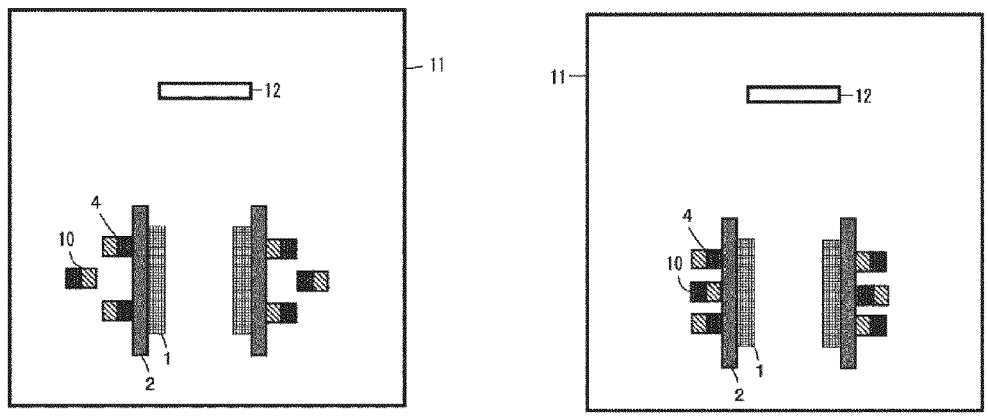
FIG. 12 is a schematic view of Embodiment 2-4 illustrating an example of making a thin film.

FIG. 12 is a view illustrating Embodiment 2-4, an example of a method of forming a thin film by using the facing sputtering device of the Embodiment 2-1.

The facing sputtering device shown in FIG. 8 is placed in a vacuum chamber 11 such that a thin film is formed on the substrate 12. First, an initial growth layer is formed in the facing mode as shown in FIG. 12(a), then the movable magnet 10 is moved with the vacuum conditions kept in the vacuum chamber 11, changing the facing mode to the mixed mode as shown in FIG. 12(b), and thus a thin film is further formed on the initial growth layer.

Figure 13:
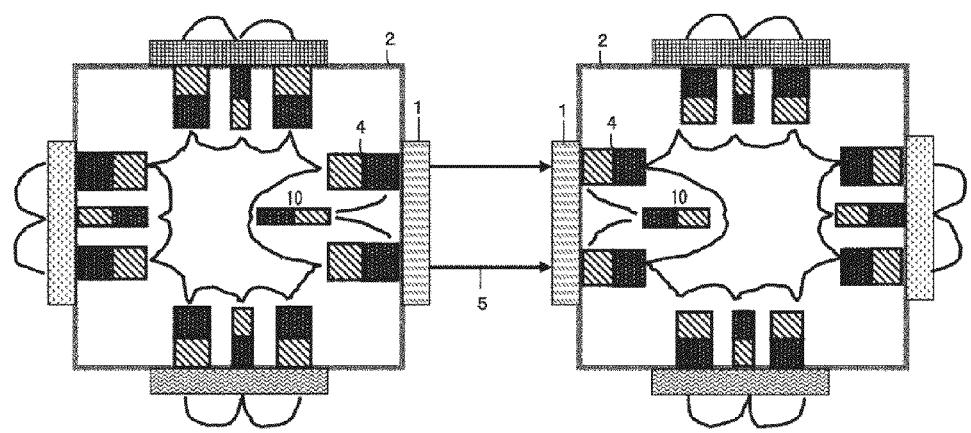
FIG. 13 is a schematic view of Embodiment 2-5 illustrating the facing target sputtering with facing mode in the rotational multi-facing target sputtering device.
Figure 14:
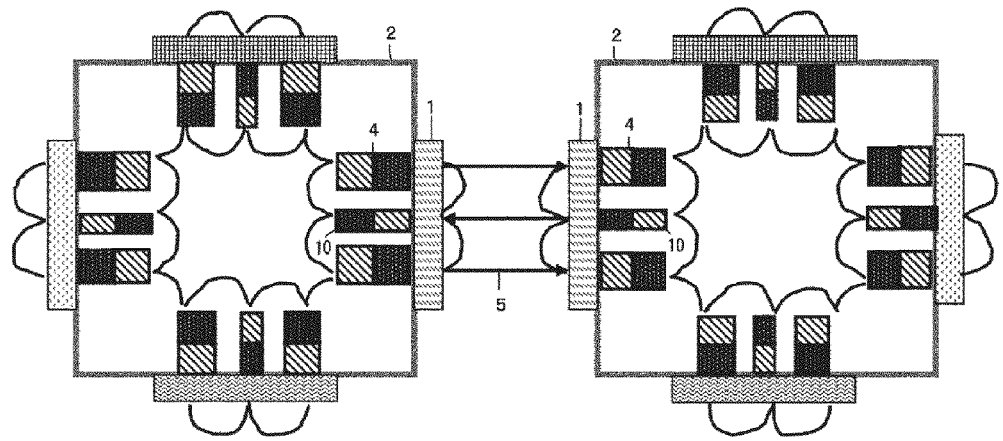
FIG. 14 is a schematic view of Embodiment 2-5 illustrating the facing target sputtering with mixed mode in the rotational multi-facing target sputtering device.

FIGS. 13 and 14 are views illustrating Embodiment 2-5. Embodiment 2-5 shows an example in which part of the back magnets of the box-type target holder 2 as shown in the patent literature 4 is formed as a movable magnet 10. FIG. 13 shows an example in which the movable magnets 10 are apart from the target holder 2 and the facing mode is formed, while FIG. 14 shows an example in which the movable magnets 10 are contacted with the target holder 2 and the mixed mode is formed. Also, only the sputtering faced surfaces are changed from the facing mode to the mixed mode, while the magnetic flux mode of the non-sputtering other surfaces are controlled to stay in the magnetron mode, and thereby restraining spread of magnetic field outside of the target holder, which has been a problem in the prior art.

Embodiment 3

Next, Embodiment 3 according to an embodiment of the present invention is described with reference to FIGS. 15 to 16.

One of the aspects of Embodiment 3 is to promote initial growth of a thin film in the facing mode and subsequently complete the formation of the thin film at high-speed in the mixed mode, without moving the substrate or breaking vacuum conditions, by using a device capable of switching the facing mode and the mixed mode based on energizing or de-energizing of the coil of the electromagnet arranged at the back side of the target holder. Furthermore, a current value flowing through the coil, that is, strength of magnetic field applied to the electromagnet can be optimally selected depending on the material used for forming a thin film by sputtering.

Figure 15:
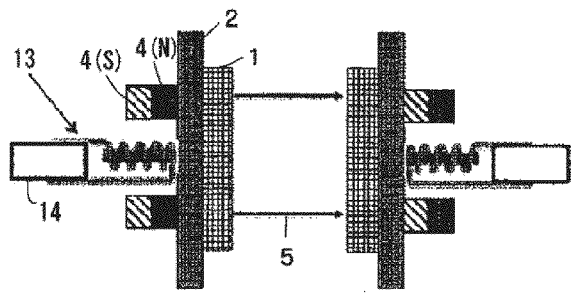
FIG. 15 is a view of Embodiment 3-1 illustrating the principle of conversion of sputtering modes by energizing and de-energizing a coil of electromagnet.
Figure 15:
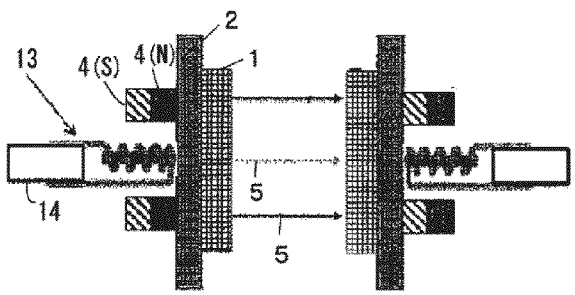
Figure 15:
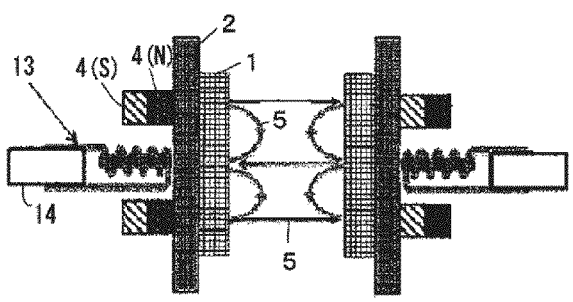

FIG. 15 shows the concept of this embodiment. This embodiment is Embodiment 3-1. The target 1 and the target holder 2 are shown in the drawing. Although two permanent magnets and a single electromagnet are shown in FIG. 15, a plurality of these magnets may be alternately placed. A plurality of these magnets may be placed checkerwise. Each pair of targets is placed face-to-face. And, the pole group respectively including the permanent magnet 4 and the electromagnet 13 is arranged at the back side of each target. A plurality of pole groups including a permanent magnet and an electromagnet, which is composed of a core of soft magnetic material such as iron and a coil wound around the core, are arranged contacted with or proximate to each back side of the pair of target holders such that the permanent magnets and the coil-energized electromagnets are facing to each other between facing pole groups with opposite magnetic poles facing to each other so as to generate magnetic flux lines 5 in different directions between the facing targets.

FIG. 15(a) shows a state in which current does not flow through a coil of electromagnet, that is, a state in which the coil is de-energized, and thus the electromagnet does not function as a magnet. As such, magnetic flux lines 5 are generated between a pair of the targets as shown in the drawing and an facing mode is formed. Generally, a permanent magnet or an iron core of electromagnet are formed in a tubular shape and a rod shape, however they are shown in cross-sectional shapes for better understanding of them in this specification.

In FIG. 15(b), the coil of electromagnet is energized such that the electromagnet has the same polarity with that of permanent magnets in a set of the pole group at the back side of the same target holder, while a set of the pole group between the facing targets are opposite to each other, thereby forming an facing mode that functions as opposite poles. A current value flowing through the coil, that is, strength of magnetic field applied to the electromagnet can be optimally selected depending on the material used for forming a thin film by sputtering.

In FIG. 15(c), the coil of electromagnet is energized such that the electromagnet has the opposite pole with respect to permanent magnets in a set of the pole group at the back side of the same target holder, while a set of the pole group are opposite each other between the facing targets, thereby forming a mixed mode that functions as opposite poles. A current value flowing through the coil, that is, strength of magnetic field applied to the electromagnet can be optimally selected depending on the material used for forming a thin film by sputtering. According to this embodiment, the coil of electromagnet is preferably energized in the pole group such that outside tubular magnets and the electromagnet placed in the center of the tubular magnets are in the non-balanced magnetron mode. That is, non-balanced arrangement is formed such that the absolute value of field intensity of outside loop magnets is larger than that of field intensity created by the electromagnet. As such, in the mixed mode composed of a combination of the facing mode and the magnetron mode, even if distance between the targets is increased, field intensity in proportion to the facing mode can be increased, and thus effect of confining γ electrons between the targets can be improved.

Although FIG. 15 shows that the facing targets are completely facing squarely to each other, each of the facing targets may be freely rotated at any angle so as to face the substrate, and thereby deposition rate of the substrate can be further increased.

Figure 16:
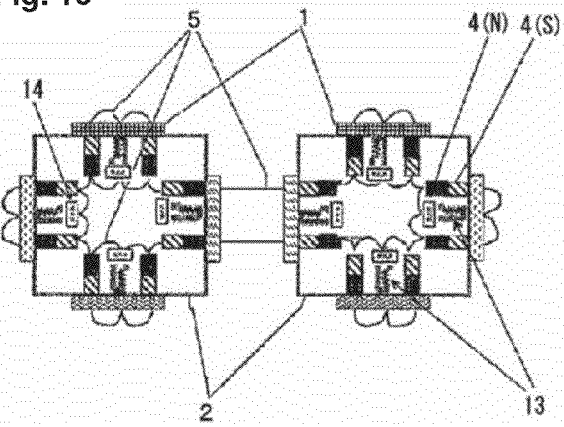
FIG. 16 is a view of Embodiment 3-2 illustrating the principle of rotational multi-facing target sputtering device.
Figure 16:
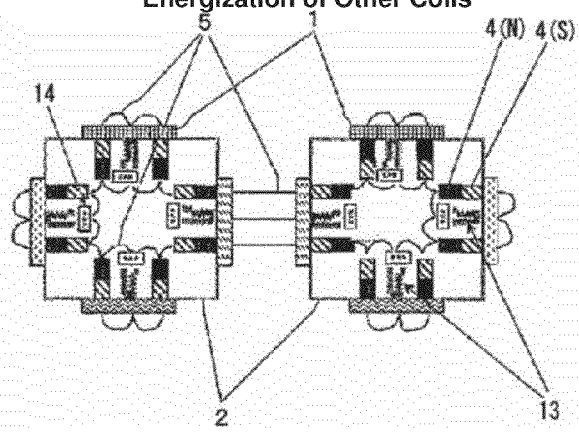
Figure 16:
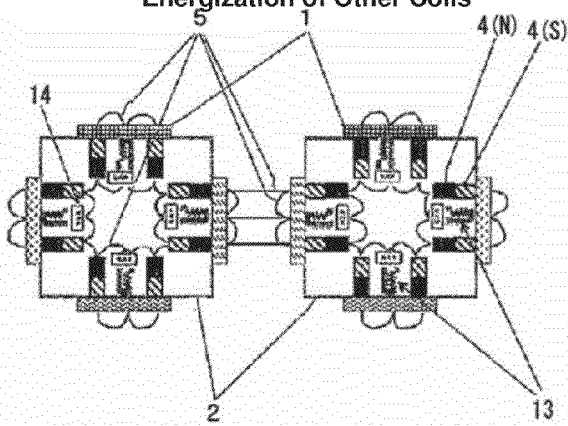

Next, FIG. 16 shows Embodiment 3-2. FIG. 16 shows a rotational multi-facing target sputtering device (also referred to as polygonal column target holder). As shown in the drawing, two polygonal column target holders are faced. The configuration of targets provided on each of surfaces and the permanent magnet and an electromagnet at the back side of the targets is the same as the configuration, which has been described above.

That is, the sputtering device for forming a thin film, in which a pair of polygonal column target holders having each of targets arranged on each surface is rotatably disposed facing to each other with the axes of rotation adapted to be in the same plane, is provided. A pole group including a set of permanent magnets and an electromagnet is provided contacted with or proximate to each rear surface of the target holder, and the pole groups are arranged to form a closed magnetic circuit in the target holder. The pole group placed on each rear surface of two facing surfaces between the facing targets is arranged to have opposite poles each other. First, an initial growth layer is produced only with a facing target sputtering with facing mode by de-energizing then energizing the coils of the electromagnets such that the electromagnets have the same polarity as the permanent magnets in a set of the pole group on the rear surfaces of the same target holder while opposite poles are formed between a set of the pole group of facing targets. Next, a subsequent thin film after the initial growth layer is produced with a facing target sputtering with mixed mode by energizing the coils of the electromagnets such that the electromagnets have opposite poles with respect to the permanent magnets in a set of the pole group on the rear surfaces of the same target holder while opposite poles are formed between a set of the pole group of the facing targets. A current value flowing through the coil, that is, strength of magnetic field applied to the electromagnet can be optimally selected depending on the material used for forming a thin film by sputtering.

That is, in FIG. 16(*a*), the magnetic flux-line patterns between the facing target holders is an facing mode without energizing the coils of the electromagnets. Other coils of the electromagnets are energized so as to be opposite poles with respect to the permanent magnets in a set of pole group on the same rear surface of the target holder, thus forming a magnetron mode, which restrains and converges a spread of magnetic field outside of the target holder, which has been a problem in prior art.

In FIG. 16 (*b*), the magnetic flux-line patterns between the facing target holders is formed in an facing mode by energizing the coils of the electromagnets such that the electromagnets between the facing target holders have the same polarity as the permanent magnets in a set of pole group on the rear surface of each target holder. Other coils of the electromagnets are energized so as to have opposite poles with respect to the permanent magnets in a set of pole group on the same rear surface of the target holder, thus forming a magnetron mode, which restrains a spread of magnetic field outside of the target holder, which has been a problem in prior art.

In FIG. 16 (*c*), the magnetic flux-line patterns between the facing target holders is formed in a mixed mode by energizing the coils of the electromagnets such that the electromagnets between the facing target holders have the opposite pole with respect to the permanent magnets in a set of pole group on the rear surface of each target holder. Other coils of the electromagnets are energized so as to have opposite poles with respect to the permanent magnets in a set of pole group on the same rear surface of the target holder, thus forming a magnetron mode, which restrains a spread of magnetic field outside of the target holder, which has been a problem in prior art.

As in the example shown in FIG. 15, a current value flowing through the coil, that is, strength of magnetic field applied to the electromagnet can be optimally selected depending on the material used for forming a thin film by sputtering. Further, the coil of electromagnet is preferably energized in the pole group such that outside tubular magnets and the electromagnet placed in the center of the tubular magnets are in the non-balanced magnetron mode. That is, non-balanced arrangement is formed such that the absolute value of field intensity of outside loop magnets is larger than that of field intensity created by the electromagnet. As such, in the mixed mode composed of a combination of the facing mode and the magnetron mode, even if distance between the targets is increased, field intensity in proportion to the facing mode can be increased, and thus effect of confining γ electrons between the targets can be improved.

In FIG. 16, it is shown that the axes of rotation of two polygonal column rotatable target holders are arranged in parallel and the facing targets are completely facing squarely to each other. However, the angles of axes of rotation of the target holders may be changed in the same plane so that each of the facing targets may be freely rotated at any angle so as to face the substrate, and thereby deposition rate of the substrate can be further increased.

As shown in FIG. 16, initial growth of thin film is promoted with the facing surfaces of a pair of the polygonal column target holders as an facing mode. The advantages of using a polygonal column target holder are to improve efficiency of forming a thin film by confining magnetic flux lines between adjacent permanent magnets and electromagnets in a box and preventing spread of magnetic flux lines, form a plurality of kinds of thin films without breaking vacuum conditions provided with a plurality of kinds of targets respectively or significantly improve operating efficiency by rotating the target holder without breaking vacuum conditions and continuing operation with a new surface when a target is worn out after use.

Although many examples of targets squarely faced to each other are shown in Embodiment 3, embodiments are not limited to these examples. Further, in the present invention, means for changing polarity of electromagnet and strengthening or weakening magnetic flux lines is not particularly limited and means for reversing a direction of current and changing a current amount is used. These methods can be adopted by using conventional means without any limitation.

Embodiment 4

Next, Embodiment 4, an example of method of forming a thin film using devices shown in Embodiments 1 to 3, is described.

One of the aspects of this Embodiment is to promote an initial growth of a thin film in an facing mode without moving the substrate or breaking vacuum conditions and subsequently complete formation of the thin film in a mixed mode at high-speed with a device capable of switching the facing mode and the mixed mode by moving a yoke or a permanent magnet at the back side of the target or controlling the electromagnet.

In this embodiment, forming a thin film in the facing mode is important. Although sputtering in the facing mode is surely disadvantageous due to slow deposition rate, deposition occurs moderately so as not to do damage to a basic substrate or previously formed thin film, or increase heat of the substrate. Thus, the formation of thin film is completed at high-speed in the mixed mode after a certain amount of initial growth takes place. Since a uniform base of thin film is preliminarily formed in the facing mode, substantially no damage is caused if deposition occurs on the initial growth layer in the mixed mode. According to findings by inventors of the present invention, deposition in the latter half, if promoted in the magnetron mode, is not preferable because incorporation of negative ions into thin film, roughness of thin-film surface, mixture of atoms with the base, etc. take place.

According to this Embodiment, generally the initial growth in the facing mode may be 5 to 30% of an intended thin film.

Although the initial growth may change depending on a sputtering material, it can be recognized by a preliminary test.

The sputtering method according to this Embodiment is preferably applied to transparent conducting films such as ITO transparent conducting film, $SnO_2$ film, $ZnO_2$ film, IZO film, Nb or Ta doped TiO film, etc., metal films such as Nb film, Ta film, Al film, etc., insulating films such as $SiO_2$ film, $Al_2O_3$ film, MgO film, etc. or ferromagnetic films such as CoFeB film, NiFe film, etc.

Further, it is possible to form a multilayer film structure including transparent conducting material, magnetic material, non-magnetic material, metal material, dielectric material, etc. in the same vacuum device. When forming a film such as an oxide film, nitride film, etc., they can be formed with Ar gas to which optimal amount of oxygen and nitride gases are added.

Hereinafter, as an example according to this Embodiment, an example of forming a thin film of transparent-conductive film, ITO film is described.

Figure 17:
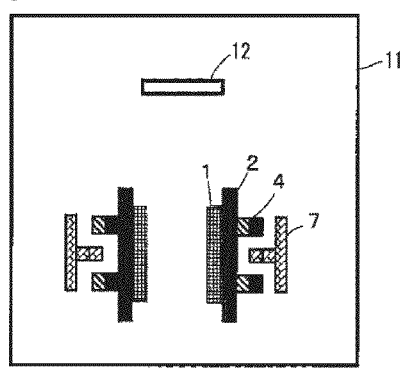
FIG. 17 is a view illustrating the principle of the device used for Embodiment 4.
Figure 17:
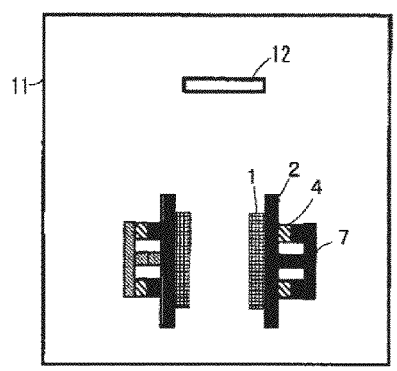
Figure 18:
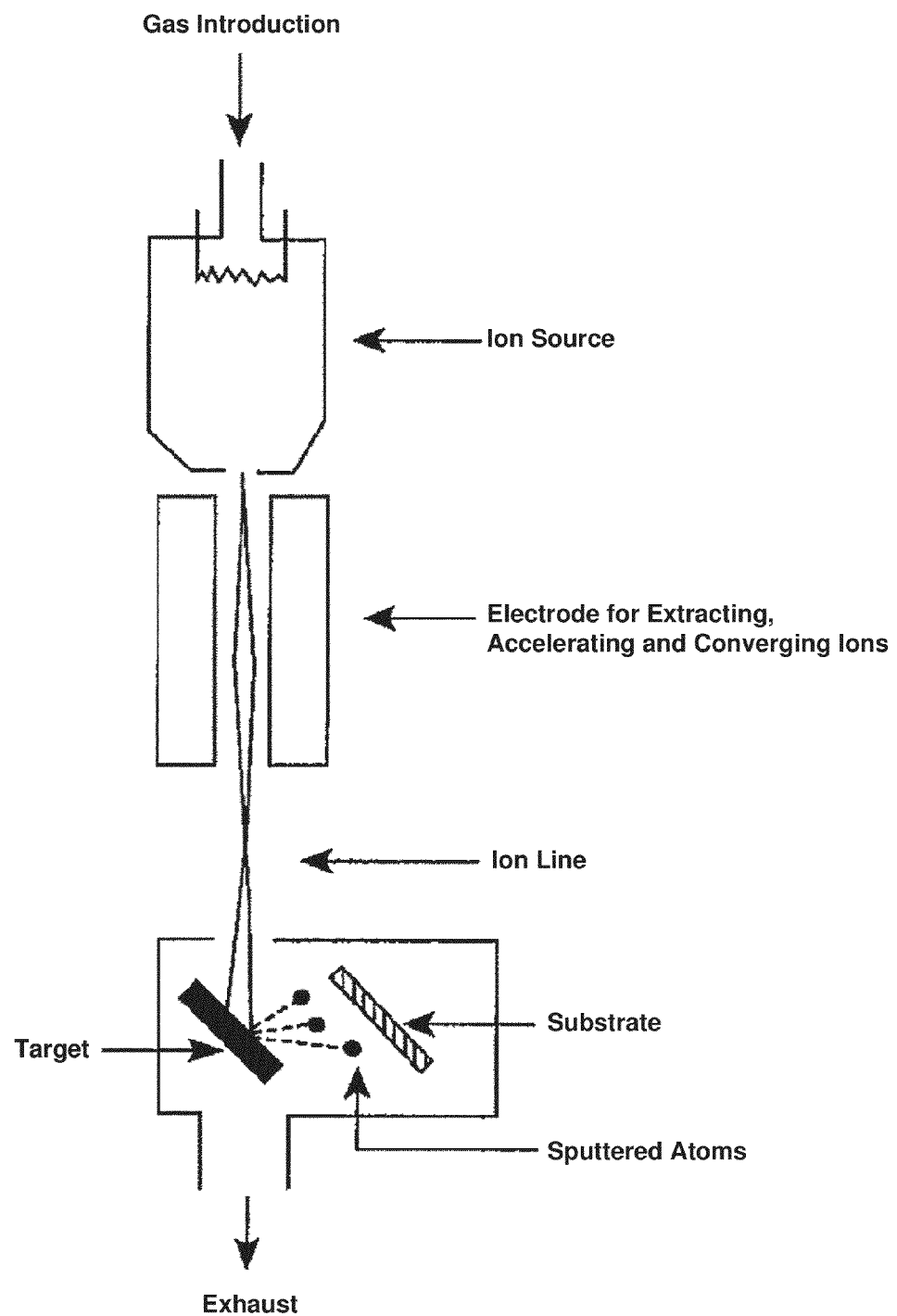
FIG. 18 is a view illustrating the principle of ion-beam sputtering.
Figure 19:
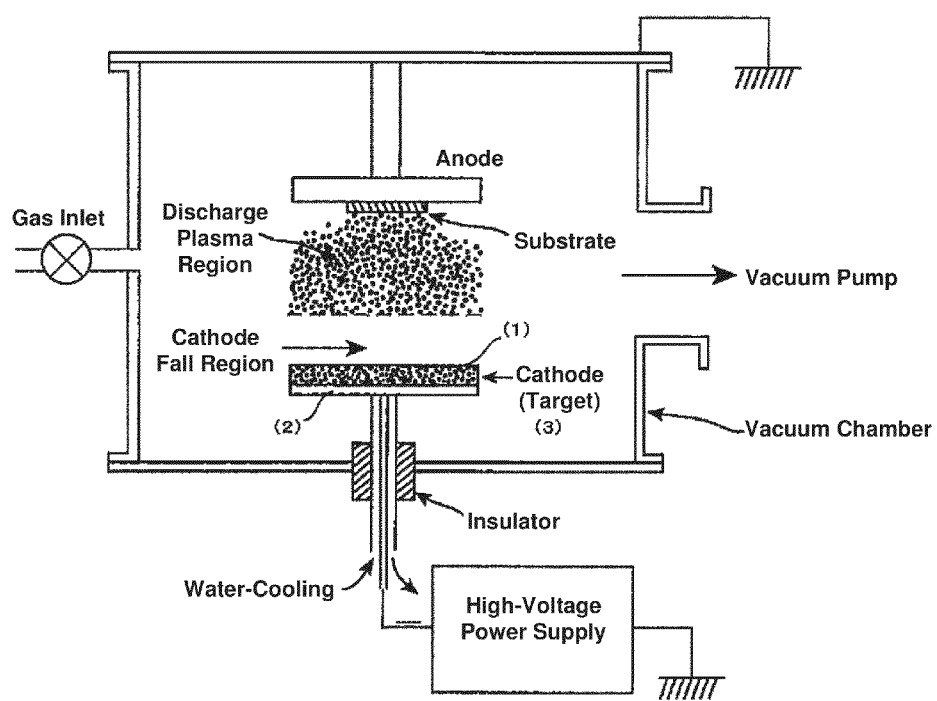
FIG. 19 is a view illustrating the principle of two-pole sputtering.
Figure 20:
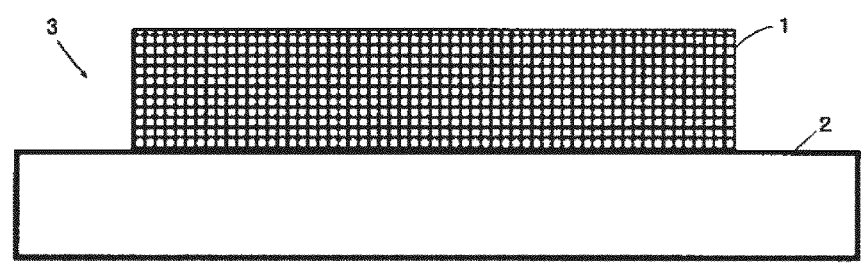
FIG. 20 is a view illustrating the principle of conventional sputtering.
Figure 21:
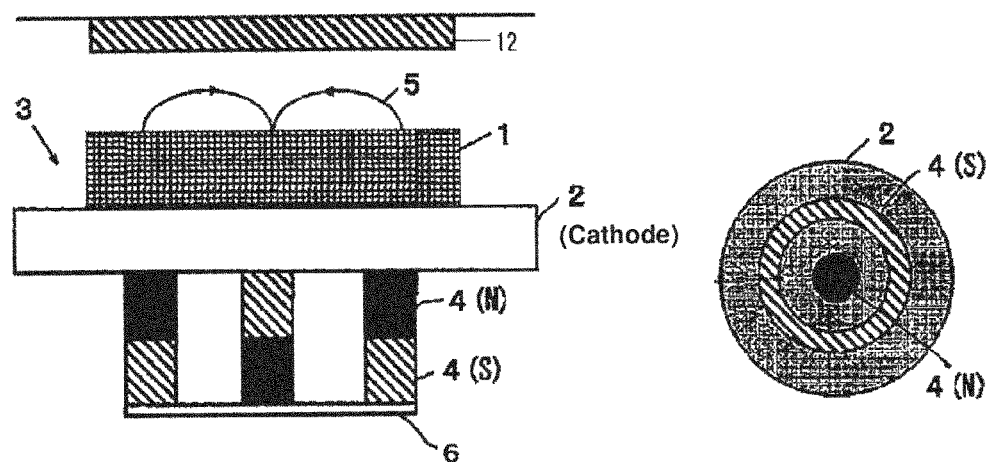
FIG. 21 is a view illustrating the principle of planar magnetron sputtering.
Figure 22:
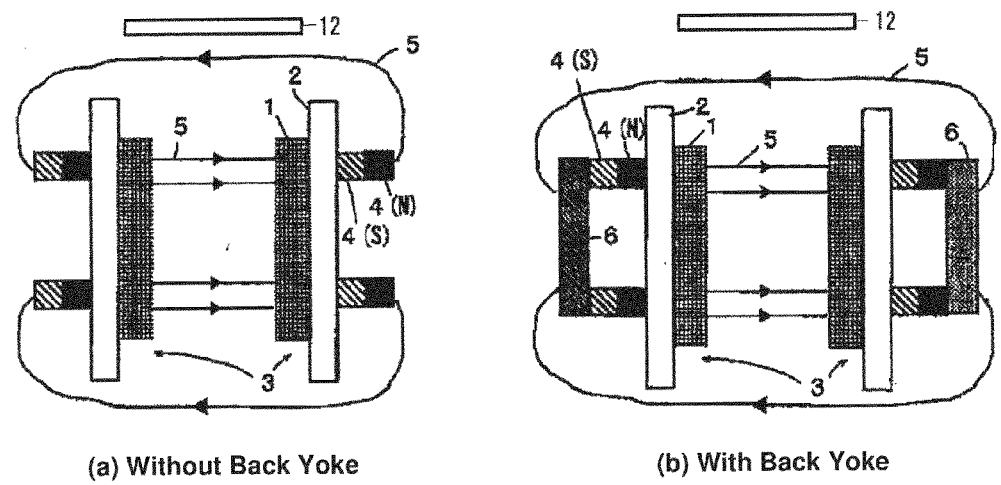
FIG. 22 is a view illustrating the principle of facing target sputtering with facing mode.
Figure 23:
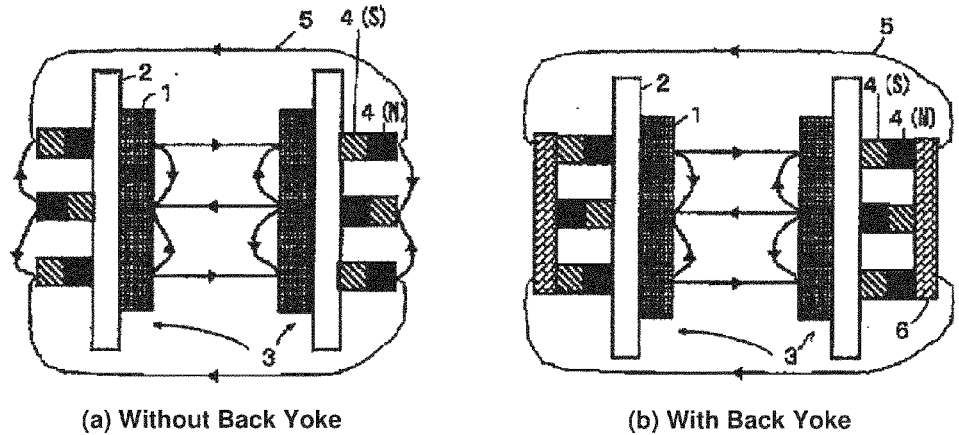
FIG. 23 is a view illustrating the principle of facing target sputtering with mixed mode when using a non-magnetic material as a target.
Figure 24:
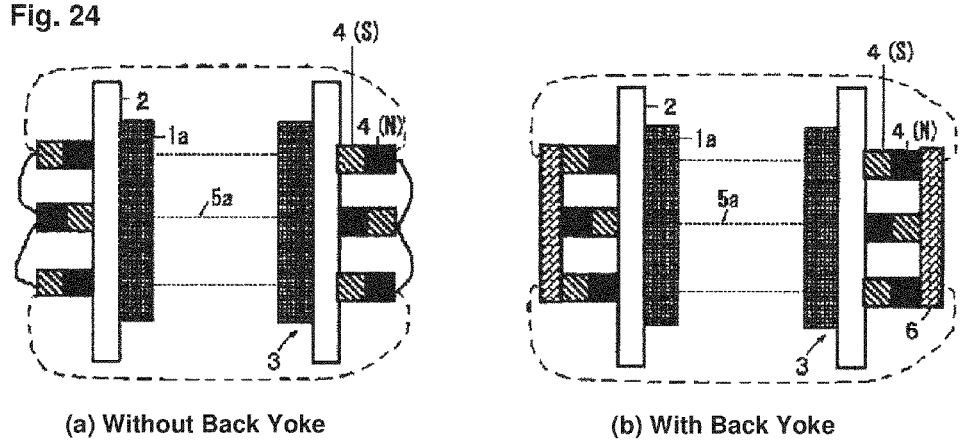
FIG. 24 is a view illustrating the principle of facing target sputtering with mixed mode when using a ferromagnetic material as a target.

FIG. 17 shows a schematic view of the device. Any of two targets, which are attached to facing and mixed switching cathodes, is 100 mm Φ in diameter and 5 mm in thickness, and is represented as $In_2O_3$-10 wt % $SnO_2$ in composition. A total sputtering pressure is 0.5 Pa and ITO film is formed by reactive sputtering with Ar gas mixed with a small amount of $O_2$ gas ($O_2$ partial pressure is 0.0 to $1.0 \times 10^{-2}$ Pa). In the facing cathode, DC applied power is 0.6 kW and the deposition rate is 60 nm/min. Under this condition, the initial growth layer is deposited by 10 nm, then the cathode is switched from the facing mode to the mixed mode without moving the substrate, and thereby the remaining 190 nm layer is deposited with DC applied power of 1.0 kW at deposition rate of 120 nm/min. Since no movement of the substrate is required, gas control systems for sputtering, provided at each of the cathodes, can be only two systems in total, i.e. each single system is provided for Ar gas and $O_2$ gas. Both layers are deposited without heating the substrate. The formed ITO film showed a preferable value 15.3 Ω/sq as sheet resistance.

Figure 25:
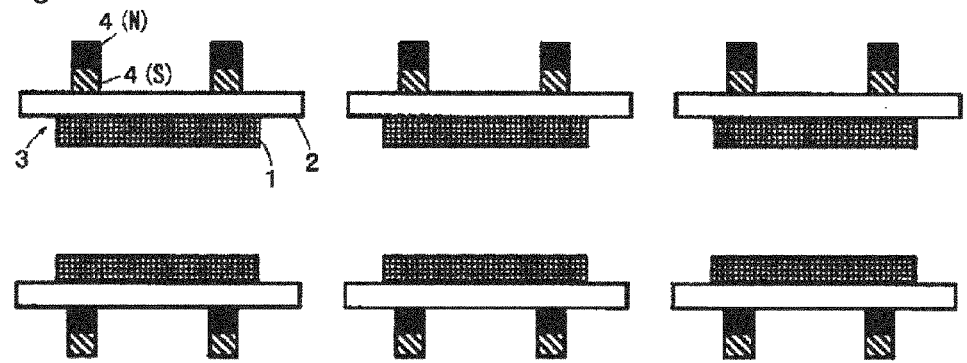
FIG. 25 is a view illustrating the principle of three-dimensional facing target sputtering.
Figure 26:
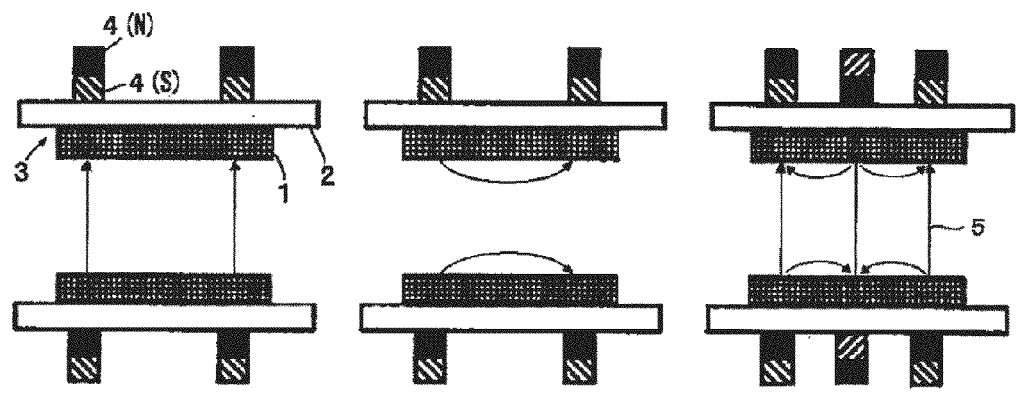
FIG. 26 is a view illustrating an example of making a thin film with a variety of modes (systems) arranged in parallel.

As comparative example 1, an ITO thin-film forming method using a method shown in FIG. 25 of the patent literature 4, in which an facing cathode and a magnetron cathode are provided in a single vacuum chamber, is described. Any of total three targets including two targets attached to the facing cathode and one target attached to the magnetron cathode is 100 mm Φ in diameter, 5 mm in thickness and is represented as $In_2O_3$-10 wt % $SnO_2$ in composition. A total sputtering pressure is 0.5 Pa and ITO film is formed by reactive sputtering with Ar gas mixed with a small amount of $O_2$ gas ($O_2$ partial pressure is 0.0 to $1.0 \times 10^{-2}$ Pa). In the facing cathode, DC applied power is 0.6 kW and the deposition rate is 60 nm/min. Under this condition, the initial growth layer is deposited by 10 nm, then the substrate is moved to above a magnetron cathode by a substrate transfer mechanism and thereby the remaining 190 nm layer is deposited with DC applied power of 0.4 kW at deposition rate of 180 nm/min. Since movement of the substrate is required, the number of gas control systems for sputtering, provided at each of the cathodes, is required to be four in total, i.e. each single system for Ar gas and $O_2$ gas is required to be provided for each cathode. Both layers are deposited without heating the substrate. The formed ITO film showed a preferable value 15.6 Ω/sq as sheet resistance.

Figure 27:
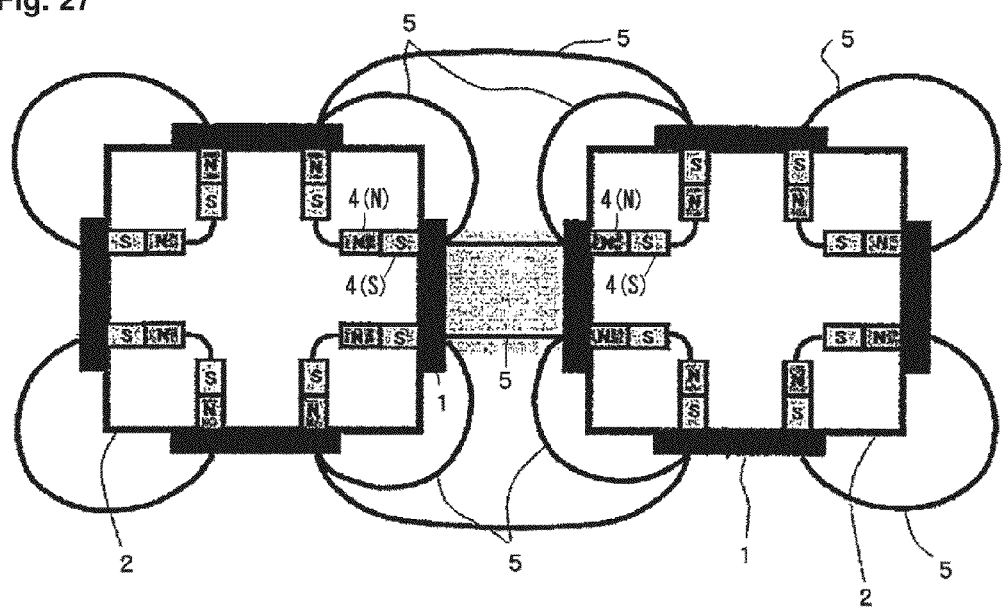
FIG. 27 is a view illustrating the principle of rotational multi-facing target sputtering device.

Next, as comparative example 2, an ITO thin-film forming method using a method shown in FIG. 27 of the patent literature 4, in which an facing cathode and a mixed cathode are provided in a single vacuum chamber, is described. Any of total four targets including two targets attached to the facing cathode and two targets attached to the mixed cathode is 100 mm Φ in diameter, 5 mm in thickness and is represented as $In_2O_3$-10 wt % $SnO_2$ in composition. A total sputtering pressure is 0.5 Pa and ITO film is formed by reactive sputtering with Ar gas mixed with a small amount of $O_2$ gas ($O_2$ partial pressure is 0.0 to $1.0 \times 10^{-2}$ Pa). In the facing cathode, DC applied power is 0.6 kW and the deposition rate is 60 nm/min. Under this condition, the initial growth layer is deposited by 10 nm, then the substrate is moved to above a mixed cathode by a substrate transfer mechanism and thereby the remaining 190 nm layer is deposited with DC applied power of 1.0 kW at deposition rate of 120 nm/min. Since movement of the substrate is required, the number of gas control systems for sputtering, provided at each of the cathodes, is required to be four in total, i.e. each single system for Ar gas and $O_2$ gas is required to be provided for each cathode. Both layers are deposited without heating the substrate. The formed ITO film showed a preferable value 15.3 Ω/sq as sheet resistance.

A crucial difference between this Embodiment and the comparative example is, when forming the same thin film, (1) chamber capacity of this Embodiment is less than half that of the comparative example. (2) No substrate transfer mechanism is required for this Embodiment. (3) A major reduction in initial cost and running cost of the device, such as use of a single gas control system or heating system for sputtering, can be achieved in this Embodiment. Also, when forming a thin film of four-layered structure, this Embodiment, performing a rotational multi-facing target sputtering device with sputtering-mode switching mechanism, requires a chamber capacity approximately less than ⅛ that of the comparative example, which requires four sets of a combination of one facing cathode and one mixed cathode, and thus further initial cost and running cost can be achieved in this Embodiment.

Although an example of embodiments according to the present invention is described, the present invention is not limited to these embodiments, and modifications not departing from the subject matter of the present invention can be made and included in the scope of the present invention.

EXPLANATIONS OF LETTERS OR NUMERALS

1: target (target main body)
1a: target of ferromagnetic material
2: target plate (target holder)
3: target unit
4: magnet
4(N): magnet (north pole)
4(S): magnet (south pole)
5: magnetic flux line
5a: weak magnetic flux lines
6: back yoke
7: movable yoke
8: fixed yoke
9: pole piece
10: movable magnet
10(N): movable magnet (north pole)
10(S): movable magnet (south pole)
11: vacuum chamber
12: substrate
13: electromagnet
14: current supply and controller

What is claimed is:

1. A method for sputtering a thin film on a substrate, comprising:
   providing a sputtering device comprising:
   first and second target holders that face each other and that are each polygonal, each of the first and second target holders including a holder surface and non-sputtering surfaces that are each different from the holder surfaces;
   a first target formed on the holder surface of the first target holder;
   a second target formed on the holder surface of the second target holder, the second target facing the first target;
   a first pole group including a plurality of first pole elements, the first pole group including a first tubular permanent magnet and a first electromagnet placed in a center of the first tubular permanent magnet, the first pole group being arranged at a back side of the first target holder opposite to said holder surface of the first target holder, at least one of the first pole elements being arranged on a surface of the first target holder opposite to the holder surface of the first target holder;
   a second pole group including a plurality of second pole elements, the second pole group including a second tubular permanent magnet and a second electromagnet placed in a center of the second tubular permanent magnet, the second pole group being arranged at a back side of the second target holder opposite to said holder surface of the second target holder, at least one of the second pole elements being arranged on a surface of the second target holder opposite to the holder surface of the second target holder;
   other pole groups each including a plurality of other pole elements that includes a non-sputtering electromagnet, each non-sputtering surface having one of the other pole groups arranged at a back side thereof,
   wherein each of the first pole elements, except the first electromagnet, is disposed directly across from a respective one of the second pole elements, that is not the second electromagnet, and has an end facing an end of the respective second pole element so that the ends have different magnetic polarities from each other; and
   a controller to control directions and strengths of electric currents through the first and second electromagnets and the non-sputtering electromagnets to change magnetic flux-line patterns between the first and second targets;
   sputtering to form a first layer in a first facing mode where magnetic flux-lines are formed between the first and second targets, and in the first facing mode the controller controls electrical energy to the non-sputtering electromagnets so that each non-sputtering electromagnet has an opposite pole direction as that of an adjacent other pole element of the respective other pole group while no electrical energy is sent to the first and second electromagnets;
   sputtering to form a second layer in a second facing mode where magnetic flux-lines are formed between the first and second targets, and in the second facing mode the controller controls
   electrical energy to the first electromagnet such that the first electromagnet has a same pole direction as that of the first tubular permanent magnet,
   electrical energy to the second electromagnet such that the second electromagnet has a same pole direction as that of the second tubular permanent magnet, and
   the electrical energy to the non-sputtering electromagnets so that each non-sputtering electromagnet has the opposite pole direction as that of the adjacent other pole element of the respective other pole group; and
   sputtering to form a third layer in a mixed mode where magnetic flux-lines are formed between the first and second targets and each of the first and second targets has formed thereupon curved magnet flux-lines that curve back thereupon, the controller controlling
   the electrical energy to the first electromagnet such that the first electromagnet has a different pole direction as that of the first tubular permanent magnet,
   the electrical energy to the second electromagnet such that the second electromagnet has a different pole direction as that of the second tubular permanent magnet, and
   the electrical energy to the non-sputtering electromagnets so that each non-sputtering electromagnet has the opposite pole direction as that of the adjacent other pole element of the respective other pole group.

2. The method according to claim 1, wherein
   the sputtering to form the third layer comprises the controller controlling
   the electrical energy to the first electromagnet such that the first electromagnet is energized in a non-balanced magnetron mode where an absolute value of a field intensity of the first tubular permanent magnet is larger than that of a field intensity of the first electromagnet,
   the electrical energy to the second electromagnet such that the second electromagnet is energized in a non-balanced magnetron mode where an absolute value of a field intensity of the second tubular permanent magnet is larger than that of a field intensity of the second electromagnet.

3. The method according to claim 2, wherein
   a strength of a magnetic field formed by the first electromagnet is selected depending on a material used for sputtering the thin film, and
   a strength of a magnetic field formed by the second electromagnet is selected depending on a material used for sputtering the thin film.

4. The method according to claim 3, further comprising promoting an initial growth of the thin film in the first and second facing modes and subsequently completing formation of the thin film in the mixed mode at a high-speed by controlling the first and second electromagnets.

5. The method according to claim 4, wherein the thin film is composed of the first, second and third layers.

6. The method according to claim 1, wherein
   a strength of a magnetic field formed by the first electromagnet is selected depending on a material used for sputtering the thin film, and
   a strength of a magnetic field formed by the second electromagnet is selected depending on a material used for sputtering the thin film.

7. A method for sputtering a thin film on a substrate, comprising:
   providing a sputtering device comprising:
   first and second target holders that face each other and that are each polygonal, each of the first and second target holders including a holder surface and other surfaces that are each different from the holder surfaces;

a first target formed on the holder surface of the first target holder;

a second target formed on the holder surface of the second target holder, the second target facing the first target;

a first pole group including a plurality of first pole elements, the first pole group including a first tubular permanent magnet and a first electromagnet placed in a center of the first tubular permanent magnet, the first pole group being arranged at a back side of the first target holder opposite to said holder surface of the first target holder, at least one of the first pole elements being arranged on a surface of the first target holder opposite to the holder surface of the first target holder;

a second pole group including a plurality of second pole elements, the second pole group including a second tubular permanent magnet and a second electromagnet placed in a center of the second tubular permanent magnet, the second pole group being arranged at a back side of the second target holder opposite to said holder surface of the second target holder, at least one of the second pole elements being arranged on a surface of the second target holder opposite to the holder surface of the second target holder;

other pole groups each including a plurality of other pole elements that includes an other electromagnet, each of the other surfaces having one of the other pole groups arranged at a back side thereof, wherein each of the first pole elements, except the first electromagnet, is disposed directly across from a respective one of the second pole elements, that is not the second electromagnet, and has an end facing an end of the respective second pole element so that the ends have different magnetic polarities from each other; and a controller to control directions and strengths of electric currents through the first and second electromagnets and the other electromagnets to change magnetic flux-line patterns between the first and second target holders; and sputtering to form a first layer in a first facing mode where magnetic flux-lines are formed between the first and second targets, and in the first facing mode the controller controls electrical energy to the other electromagnets so that each of the other electromagnets has an opposite pole direction as that of an adjacent pole element of the respective other pole group while no electrical energy is sent to the first and second electromagnets.

8. The method according to claim 7, wherein in the first pole group, the first tubular permanent magnet is an adjacent pole element of the first electromagnet, and in the second pole group, the second tubular permanent magnet is an adjacent pole element of the second electromagnet, the method further comprises sputtering to form a second layer in a second facing mode by rotating the sputtering device so that a third and fourth of the other surfaces, that respectively have third and fourth targets thereupon, face each other, the third and fourth other surfaces respectively having a third and a fourth of the other pole groups arranged at the back sides thereof, the other electromagnets of the third and fourth other pole groups being third and fourth electromagnets respectively, the third and fourth other pole groups respectively including third and fourth tubular permanent magnets, the third electromagnet being at a center of the third tubular permanent magnet, the fourth electromagnet being at a center of the fourth tubular permanent magnet, the controller controlling electrical energy so that magnetic flux-lines are formed between the third and fourth targets by controlling electrical energy to the third electromagnet such that the third electromagnet has a same pole direction as that of the third tubular permanent magnet, electrical energy to the fourth electromagnet such that the fourth electromagnet has a same pole direction as that of the fourth tubular permanent magnet, and electrical energy to each of the electromagnets, except the third and fourth electromagnets, to have an opposite pole direction as that of the adjacent pole element of the respective pole group.

9. The method according to claim 8, further comprising sputtering to form a third layer in a mixed mode by rotating the sputtering device so that a fifth and a sixth of the other surfaces, that respectively have fifth and sixth targets thereupon, face each other, the fifth and sixth other surfaces respectively having a fifth and a sixth of the other pole groups arranged at the back sides thereof, the other electromagnets of the fifth and sixth other pole groups being fifth and sixth electromagnets respectively, the fifth and sixth other pole groups respectively including fifth and sixth tubular permanent magnets, the fifth electromagnet being at a center of the fifth tubular permanent magnet, the sixth electromagnet being at a center of the sixth tubular permanent magnet, the controller controlling electrical energy so that magnetic flux-lines are formed between the fifth and sixth targets and each of the fifth and sixth targets has formed thereupon curved magnet flux-lines that curve back thereupon by controlling the electrical energy to the fifth electromagnet such that the fifth electromagnet has a different pole direction as that of the fifth tubular permanent magnet, the electrical energy to the sixth electromagnet such that the sixth electromagnet has a different pole direction as that of the sixth tubular permanent magnet, and the electrical energy to each of the electromagnets, except the fifth and sixth electromagnets, to have an opposite pole direction as that of the adjacent pole element of the respective pole group.

\* \* \* \* \*